(12) United States Patent
Odnoblyudov et al.

(10) Patent No.: US 10,573,516 B2
(45) Date of Patent: Feb. 25, 2020

(54) METHODS FOR INTEGRATED DEVICES ON AN ENGINEERED SUBSTRATE

(71) Applicant: QROMIS, Inc., Santa Clara, CA (US)

(72) Inventors: Vladimir Odnoblyudov, Danville, CA (US); Dilip Risbud, San Jose, CA (US); Ozgur Aktas, Pleasanton, CA (US); Cem Basceri, Los Gatos, CA (US)

(73) Assignee: Qromis, Inc., Santa Clara, CA (US)

( * ) Notice: Subject to any disclaimer, the term of this patent is extended or adjusted under 35 U.S.C. 154(b) by 0 days.

(21) Appl. No.: 16/207,793

(22) Filed: Dec. 3, 2018

(65) Prior Publication Data

US 2019/0172709 A1 Jun. 6, 2019

Related U.S. Application Data

(60) Provisional application No. 62/595,533, filed on Dec. 6, 2017.

(51) Int. Cl.
| | | |
|---|---|---|
| *H01L 21/02* | (2006.01) | |
| *H01L 27/12* | (2006.01) | |
| *H01L 21/84* | (2006.01) | |
| *H01L 33/00* | (2010.01) | |

(Continued)

(52) U.S. Cl.
CPC .... *H01L 21/02505* (2013.01); *H01L 21/0245* (2013.01); *H01L 21/0254* (2013.01); *H01L 21/02389* (2013.01); *H01L 21/02488* (2013.01); *H01L 21/02513* (2013.01); *H01L 21/84* (2013.01); *H01L 27/1203* (2013.01); *H01L 21/0242* (2013.01); *H01L 21/02238* (2013.01); *H01L 21/02255* (2013.01);

(Continued)

(58) Field of Classification Search
CPC ....................................................... H01L 21/02
See application file for complete search history.

(56) References Cited

U.S. PATENT DOCUMENTS

| | | |
|---|---|---|
| 9,082,692 B2 | 7/2015 | Odnoblyudov et al. |
| 2006/0163605 A1 | 7/2006 | Miyahara |
| 2017/0179307 A1 | 6/2017 | Dang et al. |

(Continued)

OTHER PUBLICATIONS

International Search Report and Written Opinion of the International Searching Authority of corresponding International Application PCT/US2018/063817 dated Feb. 11, 2019 (twelve pages).

*Primary Examiner* — Marvin Payen
(74) *Attorney, Agent, or Firm* — Kilpatrick Townsend & Stockton LLP

(57) ABSTRACT

A method of forming a plurality of devices on an engineered substrate structure includes forming an engineered substrate by providing a polycrystalline ceramic core, encapsulating the polycrystalline ceramic core with a first adhesion shell, encapsulating the first adhesion shell with a barrier layer, forming a bonding layer on the barrier layer, and forming a substantially single crystal layer coupled to the bonding layer. The method further comprises forming a buffer layer coupled to the substantially single crystal layer, forming one or more epitaxial III-V layers on the buffer layer according to requirements associated with the plurality of devices, and forming the plurality of devices on the substrate by removing a portion of the one or more epitaxial III-V layers disposed between the plurality of devices and removing a portion of the buffer layer disposed between the plurality of devices.

20 Claims, 19 Drawing Sheets

(51) Int. Cl.
*H01L 21/762* (2006.01)
*H01L 21/311* (2006.01)

(52) U.S. Cl.
CPC ... *H01L 21/02658* (2013.01); *H01L 21/31111* (2013.01); *H01L 21/76254* (2013.01); *H01L 33/007* (2013.01)

(56) References Cited

U.S. PATENT DOCUMENTS

2017/0288055 A1 10/2017 Aktas et al.
2018/0061630 A1 3/2018 Odnoblyudov et al.

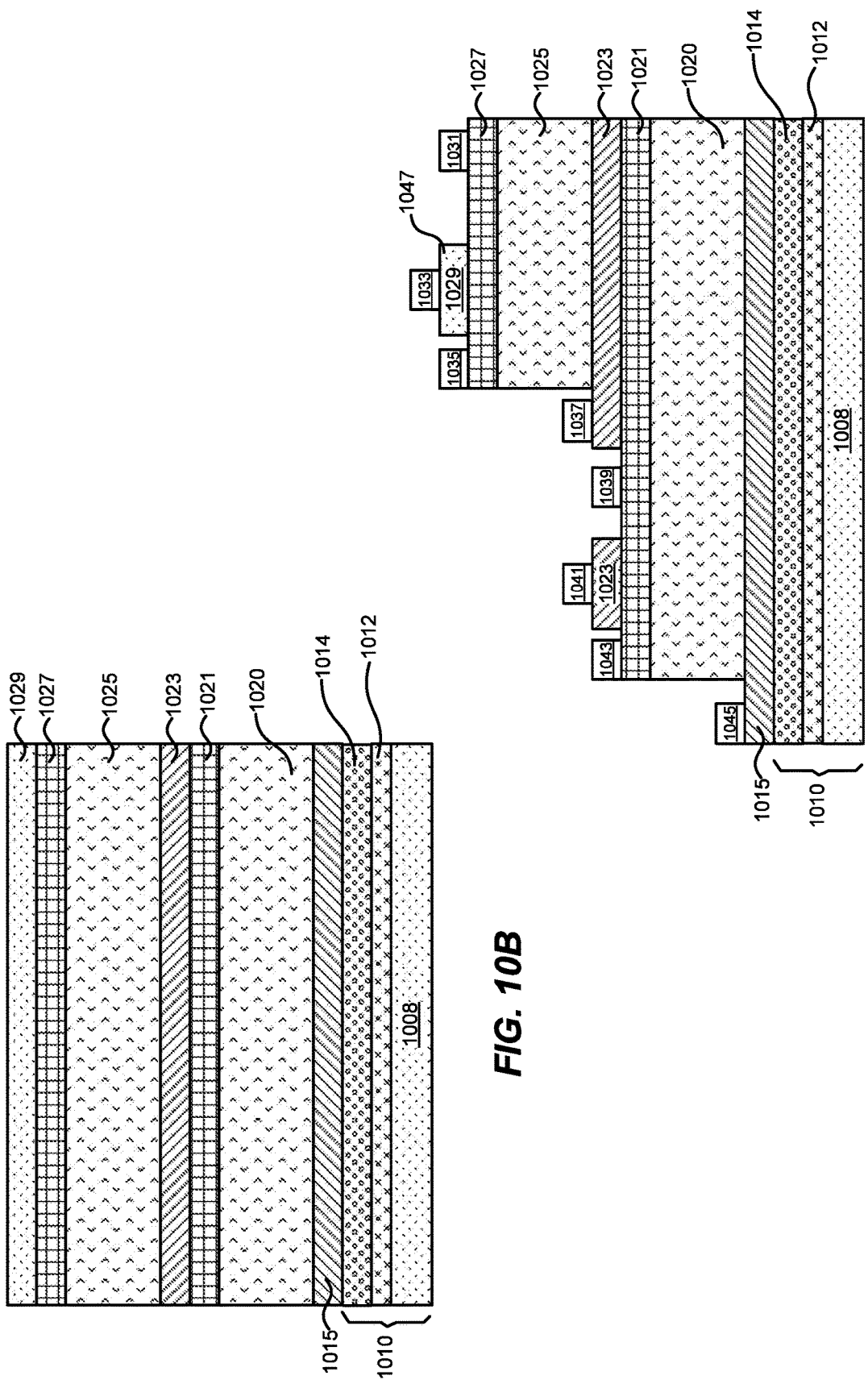

METHODS FOR INTEGRATED DEVICES ON AN ENGINEERED SUBSTRATE

CROSS-REFERENCES TO RELATED APPLICATIONS

This application claims priority to U.S. Provisional Patent Application No. 62/595,533, filed on Dec. 6, 2017, the disclosure of which is hereby incorporated by reference in its entirety for all purposes.

BACKGROUND OF THE INVENTION

Heteroepitaxy of gallium nitride based compound semiconductors on sapphire, silicon carbide and silicon is currently used to fabricate devices such as light-emitting diodes (LEDs), high power devices, and high speed radio frequency (RF) devices. Applications include lighting, computer monitors, displays, wide band gap communications, automotive, and industrial power sources. The growth of gallium nitride based devices on a sapphire substrate is a heteroepitaxial growth process since the substrate and the epitaxial layers are composed of different materials. Due to the heteroepitaxial growth process, the epitaxially grown material can exhibit a variety of adverse effects, including reduced uniformity and reductions in metrics associated with the electronic/optical properties of the epitaxial layers. Accordingly, there is a need in the art for improved methods and systems related to epitaxial growth processes and substrate structures used to fabricate devices.

SUMMARY OF THE INVENTION

The present invention relates generally to III-V semiconductor devices formed on engineered substrate structures. More specifically, the present invention relates to methods and systems suitable for fabricating integrated gallium nitride (GaN) semiconductor devices using epitaxial growth processes. As described herein, embodiments of the present invention have been applied to methods and systems for integrating different types of GaN devices monolithically on the same engineered substrate structure.

According to an embodiment of the present invention, a method of forming a plurality of devices on a substrate is provided. The method comprises forming a substrate by providing a polycrystalline ceramic core, encapsulating the polycrystalline ceramic core with a first adhesion shell, encapsulating the first adhesion shell with a barrier layer, forming a bonding layer on the barrier layer, and forming a substantially single crystal layer coupled to the bonding layer. The method further comprises forming a buffer layer coupled to the substantially single crystal layer, forming one or more epitaxial III-V layers on the buffer layer according to requirements associated with the plurality of devices, and forming the plurality of devices on the substrate by removing a portion of the one or more epitaxial III-V layers disposed between the plurality of devices and removing a portion of the buffer layer disposed between the plurality of devices. In some embodiments, the one or more epitaxial III-V layers may include GaN.

In some embodiments, the method can include planarizing the plurality of devices on the substrate. Planarizing the plurality of devices can include forming a dielectric layer on the plurality of devices and smoothing the plurality of devices using chemical-mechanical planarization. In some embodiments, the method can include fabricating one or more interconnects between a first device of the plurality of devices and a second device of the plurality of devices. Optionally, the method can include bonding a first surface on each of the plurality of devices to a temporary carrier, wherein the first surface is opposed to the substrate, removing the substrate to expose a second surface on each of the devices, forming a conducting layer on the second surface, and bonding a carrier wafer to the conducting layer. In some embodiments, the method includes removing one or more sections of the carrier wafer to form one or more backside contacts.

According to another embodiment of the present invention, a method of forming a plurality of devices on a substrate is provided. The method comprises forming a substrate by providing a polycrystalline ceramic core, encapsulating the polycrystalline ceramic core with an adhesion shell, encapsulating the adhesion shell with a barrier layer, forming a bonding layer on the barrier layer, and forming a substantially single crystal layer coupled to the bonding layer. The method further comprises forming a conducting layer coupled to the substantially single crystal layer, forming a buffer layer coupled to the conducting layer, and forming one or more epitaxial III-V layers on the buffer layer according to requirements for each of the plurality of devices. The method further comprises forming the plurality of devices by removing a portion of the one or more epitaxial III-V layers and a portion of the buffer layer disposed between the plurality of devices to expose a portion of the conducting layer, forming a contact coupled to a portion of the exposed portion of the conducting layer; and removing a remaining exposed portion of the conducting layer not coupled to the contact. In some embodiments, the one or more epitaxial III-V layers may include GaN.

In some embodiments, the method further comprises planarizing the plurality of devices on the substrate. Planarizing the plurality of devices can include forming a dielectric layer on the plurality of devices and smoothing the plurality of devices using chemical-mechanical planarization. Optionally, the method can include fabricating one or more interconnects between a first device of the plurality of devices and a second device of the plurality of devices. In some embodiments, the method can include bonding a first surface on each of the plurality of devices to a temporary carrier, wherein the first surface is opposed to the substrate, removing the substrate to expose a second surface on each of the devices, forming a conducting layer on the second surface, and bonding a carrier wafer to the conducting layer. In some embodiments, the method includes removing one or more sections of the carrier wafer to form one or more backside contacts.

According to a further embodiment, a method of forming a plurality of devices is provided. The method comprises forming a substrate by providing a polycrystalline ceramic core, encapsulating the polycrystalline ceramic core with a first adhesion shell, encapsulating the first adhesion shell with a barrier layer, forming a bonding layer on the barrier layer, and forming a substantially single crystal layer coupled to the bonding layer. The method further comprises forming a first mask with a first exposed portion of the substantially single crystal layer, forming a first buffer layer associated with a first device structure on the first exposed portion, removing the first mask, forming a second mask with a second exposed portion of the substantially single crystal layer, forming a second buffer layer associated with a second device structure on the second exposed portion, forming one or more epitaxial III-V layers on the first buffer layer and the second buffer layer, wherein the one or more epitaxial III-V layers are formed according to requirements associated with the plurality of devices, and etching between the plurality of devices.

In some embodiments, the method further comprises planarizing the plurality of devices on the substrate. Planarizing the plurality of devices can include forming a dielectric layer on the plurality of devices and smoothing the plurality of devices using chemical-mechanical planarization. Optionally, the method can include fabricating one or more interconnects between a first device of the plurality of devices and a second device of the plurality of devices. In some embodiments, the method can include bonding a first surface on each of the plurality of devices to a temporary carrier, wherein the first surface is opposed to the substrate, removing the substrate to expose a second surface on each of the devices, forming a conducting layer on the second surface, and bonding a carrier wafer to the conducting layer. In some embodiments, the method includes removing one or more sections of the carrier wafer to form one or more backside contacts.

In some embodiments, the method further comprises forming a conducting layer coupled to the substantially single crystal layer and at least one of the first buffer layer and the second buffer layer, exposing a portion of the conducting layer, and forming a contact on the exposed portion of the conducting layer. Optionally, etching between the plurality of devices can include etching to the polycrystalline ceramic core.

According to some embodiments, a semiconductor apparatus includes a substrate. The substrate may include a polycrystalline ceramic core, a first adhesion shell encapsulating the polycrystalline ceramic core, a barrier layer encapsulating the first adhesion shell, a bonding layer coupled to the barrier layer, and a substantially single crystal layer coupled to the bonding layer. The semiconductor apparatus further includes a buffer layer coupled to the substantially single crystal layer, and one or more epitaxial III-V layers coupled to the buffer layer. The one or more epitaxial III-V layers define a trench that divides the one or more epitaxial III-V layers into a first section and a second section. The semiconductor apparatus further includes a first semiconductor device formed in the first section of the one or more epitaxial III-V layers, and a second semiconductor device formed in the second section of the one or more epitaxial III-V layers.

In some embodiments, the first semiconductor device is a depletion-mode high electron mobility transistor (HEMT), and the second semiconductor device is an enhancement-mode HEMT. In some other embodiments, the first semiconductor device is a first depletion-mode high electron mobility transistor (HEMT), and the second semiconductor device is a second depletion-mode HEMT. In some further embodiments, the first semiconductor device is a first enhancement-mode high electron mobility transistor (HEMT), and the second semiconductor device is a second enhancement-mode HEMT. In some embodiments, the semiconductor apparatus further includes a conducting layer disposed between the substantially single crystal layer and the buffer layer. In some embodiments, the first semiconductor device is a high electron mobility transistor (HEMT), and the second semiconductor device is a vertical semiconductor device. In some embodiments, the vertical semiconductor device is a vertical P-N diode or a vertical Schottky diode.

In some embodiments, the polycrystalline ceramic core may comprise aluminum nitride. The first adhesion layer may comprise tetraethyl ortho silicate (TEOS) oxide layer. The barrier layer may comprise silicon nitride. The bonding layer may comprise silicon oxide. The substantially single crystal layer may comprise silicon. The one or more epitaxial III-V layers may include GaN and AlGaN layers.

These and other embodiments of the invention along with many of its advantages and features are described in more detail in conjunction with the text below and attached figures.

BRIEF DESCRIPTION OF THE DRAWINGS

FIG. 10B is a simplified schematic cross-sectional diagram illustrating a plurality of epitaxial III-V layers formed on an engineered substrate according to another embodiment of the present invention.

FIG. 10C is a simplified schematic cross-sectional diagram illustrating a plurality of devices formed on an engineered substrate according to another embodiment of the present invention.

DETAILED DESCRIPTION OF SPECIFIC EMBODIMENTS

The present invention relates generally to integrating semiconductor devices on engineered substrate structures. More specifically, the present invention relates to methods suitable for fabricating different III-V semiconductor devices using epitaxial growth processes. Merely by way of example, the invention has been applied to a method and system for fabricating different III-V semiconductor devices by epitaxial growth, wherein the substrate structure is characterized by a coefficient of thermal expansion (CTE) that is substantially matched to epitaxial layers that form the power devices. The methods and techniques can be applied to a variety of semiconductor processing operations.

Figure 1:
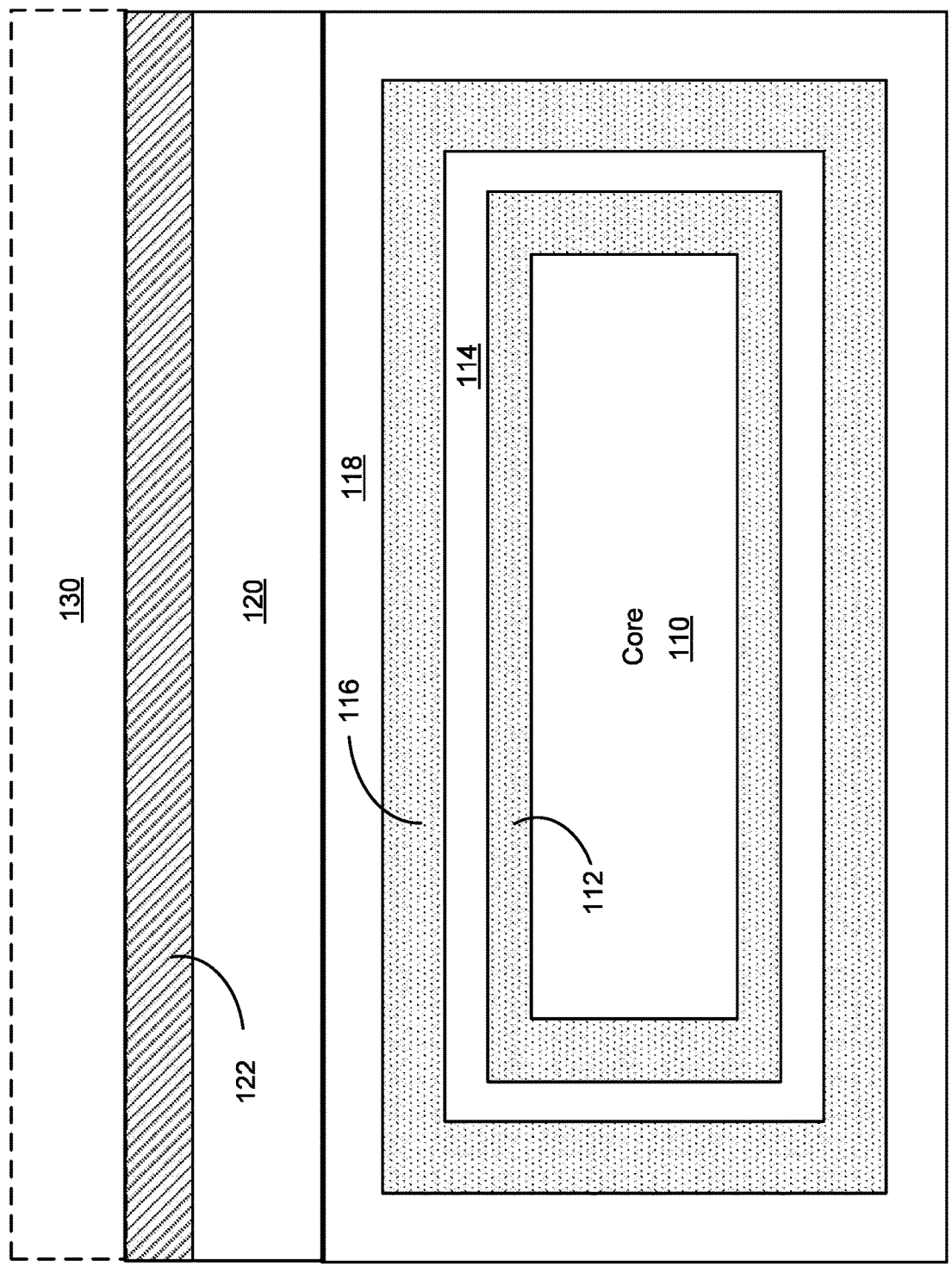
FIG. 1 is a simplified schematic cross-sectional diagram illustrating an engineered substrate structure according to an embodiment of the present invention.

FIG. 1 is a simplified schematic cross-sectional diagram illustrating an engineered substrate structure according to an embodiment of the present invention. The engineered substrate 100 illustrated in FIG. 1 is suitable for a variety of electronic and optical applications.

The engineered substrate 100 includes a core 110 that can have a coefficient of thermal expansion (CTE) that is substantially matched to the CTE of the epitaxial material that will be grown on the engineered substrate 100. Epitaxial material 130 is illustrated as optional because it is not required as an element of the engineered substrate 100, but will typically be grown on the engineered substrate 100.

For applications including the growth of gallium nitride (GaN)-based materials (epitaxial layers including GaN-based layers), the core 110 can be a polycrystalline ceramic material such as polycrystalline aluminum nitride (AlN), which can include a binding material such as yttrium oxide. Other materials can be utilized in the core 110, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like.

The thickness of the core can be on the order of 100 μm to 1,500 μm, for example, 725 μm. The core 110 is encapsulated in an adhesion layer 112 that can be referred to as a shell or an encapsulating shell. In an embodiment, the adhesion layer 112 comprises a tetraethyl orthosilicate (TEOS) oxide layer on the order of 1,000 Å in thickness. In other embodiments, the thickness of the adhesion layer varies, for example, from 100 Å to 2,000 Å. Although TEOS oxides are utilized for adhesion layers in some embodiments, other materials that provide for adhesion between later deposited layers and underlying layers or materials (e.g., ceramics, in particular, polycrystalline ceramics) can be utilized according to an embodiment of the present invention. For example, $SiO_2$ or other silicon oxides ($Si_xO_y$) adhere well to ceramic materials and provide a suitable surface for subsequent deposition, for example, of conductive materials. In some embodiments, the adhesion layer 112 completely surrounds the core 110 to form a fully encapsulated core. The adhesion layer 112 can be formed using a low pressure chemical-vapor deposition (LPCVD) process. The adhesion layer provides a surface on which subsequent layers adhere to form elements of the engineered substrate 100 structure.

In addition to the use of LPCVD processes, furnace-based processes, and the like to form the encapsulating first adhesion layer, other semiconductor processes can be utilized according to embodiments of the present invention, including CVD processes or similar deposition processes. As an example, a deposition process that coats a portion of the core can be utilized, the core can be flipped over, and the deposition process could be repeated to coat additional portions of the core. Thus, although LPCVD techniques are utilized in some embodiments to provide a fully encapsulated structure, other film formation techniques can be utilized depending on the particular application.

A conductive layer 114 is formed surrounding the adhesion layer 112. In an embodiment, the conductive layer 114 is a shell of polysilicon (i.e., polycrystalline silicon) that is formed surrounding the first adhesion layer 112 since polysilicon can exhibit poor adhesion to ceramic materials. In embodiments in which the conductive layer 114 is polysilicon, the thickness of the polysilicon layer can be on the order of 500-5,000 Å, for example, 2,500 Å. In some embodiments, the polysilicon layer can be formed as a shell to completely surround the first adhesion layer 112 (e.g., a TEOS oxide layer), thereby forming a fully encapsulated first adhesion layer, and can be formed using an LPCVD process. In other embodiments, as discussed below, the conductive material can be formed on a portion of the adhesion layer, for example, a lower half of the substrate structure. In some embodiments, conductive material can be formed as a fully encapsulating layer and subsequently removed on one side of the substrate structure.

In an embodiment, the conductive layer 114 can be a polysilicon layer doped to provide a highly conductive material, for example, doped with boron to provide a P-type polysilicon layer. In some embodiments, the doping with boron is at a level of $1\times10^{19}$ $cm^{-3}$ to $1\times10^{20}$ $cm^{-3}$ to provide for high conductivity. Other dopants at different dopant concentrations (e.g., phosphorus, arsenic, bismuth, or the like at dopant concentrations ranging from $1\times10^{16}$ $cm^{-3}$ to $5\times10^{18}$ $cm^{-3}$) can be utilized to provide either N-type or P-type semiconductor materials suitable for use in the conductive layer 114. One of ordinary skill in the art would recognize many variations, modifications, and alternatives.

The presence of the conductive layer 114 is useful during electrostatic chucking of the engineered substrate 100 to semiconductor processing tools, for example tools with electrostatic discharge (ESD) chucks. The conductive layer 114 enables rapid dechucking after processing in the semiconductor processing tools. Thus, embodiments of the present invention provide substrate structures that can be processed in manners utilized with conventional silicon wafers. One of ordinary skill in the art would recognize many variations, modifications, and alternatives.

A second adhesion layer 116 (e.g., a TEOS oxide layer on the order of 1,000 Å in thickness) is formed surrounding the conductive layer 114. In some embodiments, the second adhesion layer 116 completely surrounds the conductive layer 114 to form a fully encapsulated structure. The second adhesion layer 116 can be formed using an LPCVD process, a CVD process, or any other suitable deposition process, including the deposition of a spin-on dielectric.

A barrier layer 118, for example, a silicon nitride layer, is formed surrounding the second adhesion layer 116. In an embodiment, the barrier layer 118 is a silicon nitride layer that is on the order of 4,000 Å to 5,000 Å in thickness. The barrier layer 118 completely surrounds the second adhesion layer 116 in some embodiments to form a fully encapsulated structure and can be formed using an LPCVD process. In addition to silicon nitride layers, amorphous materials including SiCN, SiON, AlN, SiC, and the like can be utilized as barrier layers. In some implementations, the barrier layer consists of a number of sub-layers that are built up to form the barrier layer. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer, e.g., a silicon nitride layer, prevents diffusion and/or outgassing of elements present in the core 110 into the environment of the semiconductor processing chambers in which the engineered substrate 100 could be present, for example, during a high temperature (e.g., 1,000° C.) epitaxial growth process. Elements present in the core 110 can include, for example, yttrium oxide (i.e., yttria), oxygen, metallic impurities, other trace elements, and the like. The elements diffused from the core 110 can cause unintentional doping in engineered layers 120/122. The elements outgassed from the core 110 can travel through the chamber and adsorb elsewhere on the wafer causing impurities in engineered layers 120/122 and epitaxial material 130. Utilizing the encapsulating layers described herein, ceramic materials, including polycrystalline AlN that are designed for non-clean room environments, can be utilized in semiconductor process flows and clean room environments.

Figure 2A:
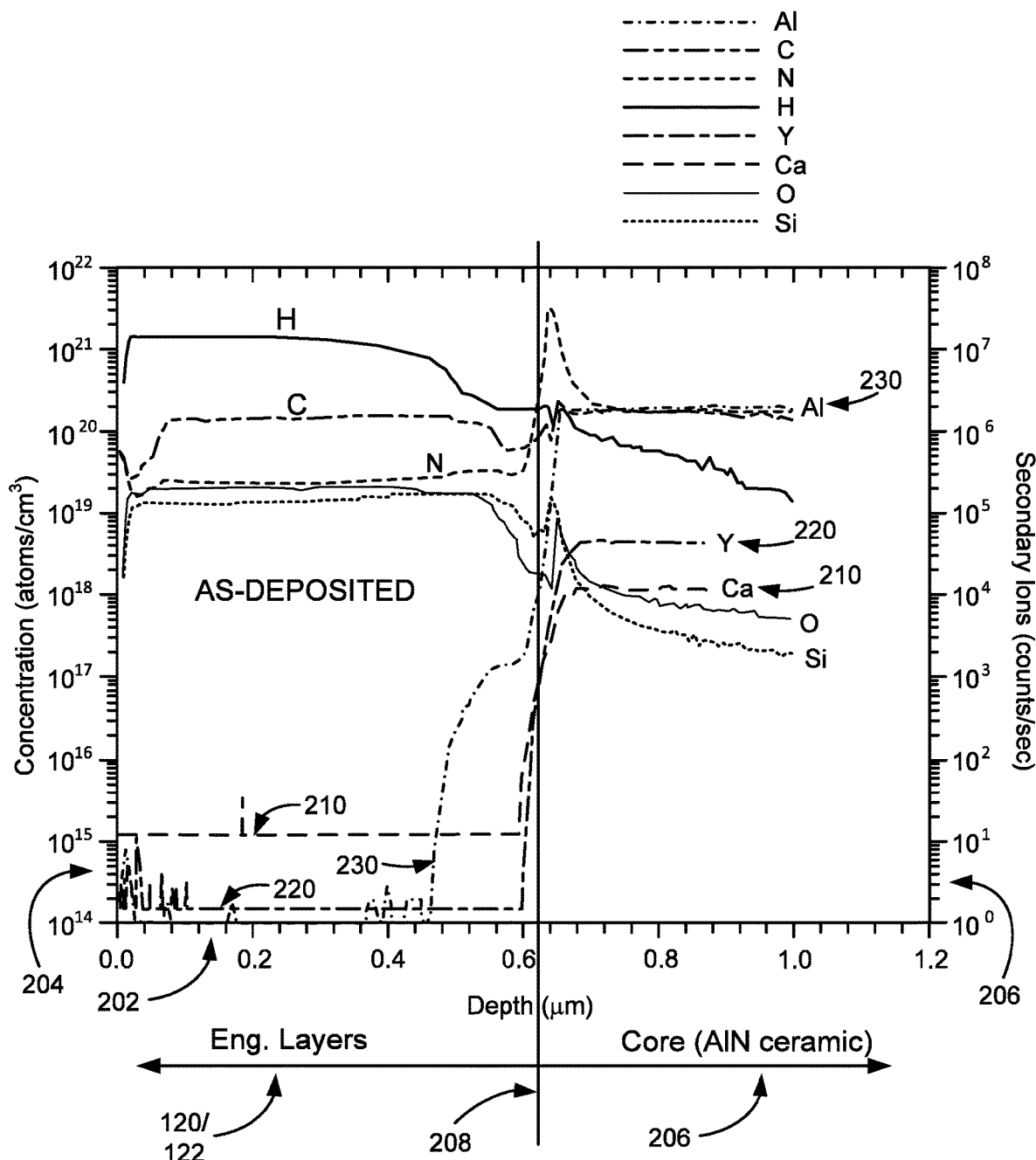
FIG. 2A is a SIMS profile illustrating species concentration as a function of depth for an engineered structure according to an embodiment of the present invention.

FIG. 2A is a secondary ion mass spectroscopy (SIMS) profile illustrating species concentration as a function of depth for an engineered structure according to an embodiment of the present invention. The x-axis represents the depth 202 from the surface of the engineered layers 120/122 to the core 110. Line 208 represents the interface between the engineered layers 120/122 and the core 110. A first y-axis represents the species concentration of atoms per cubic centimeter 204. A second y-axis represents the signal intensity of the ions in counts per second 206. The engineered structure in FIG. 2A did not include barrier layer 118. Referring to FIG. 2A, several species present in the ceramic core 110 (e.g., yttrium, calcium, and aluminum) drop to negligible concentrations in the engineered layers 120/122. The concentrations of calcium 210, yttrium 220, and aluminum 230 drop by three, four, and six orders of magnitude, respectively.

Figure 2B:
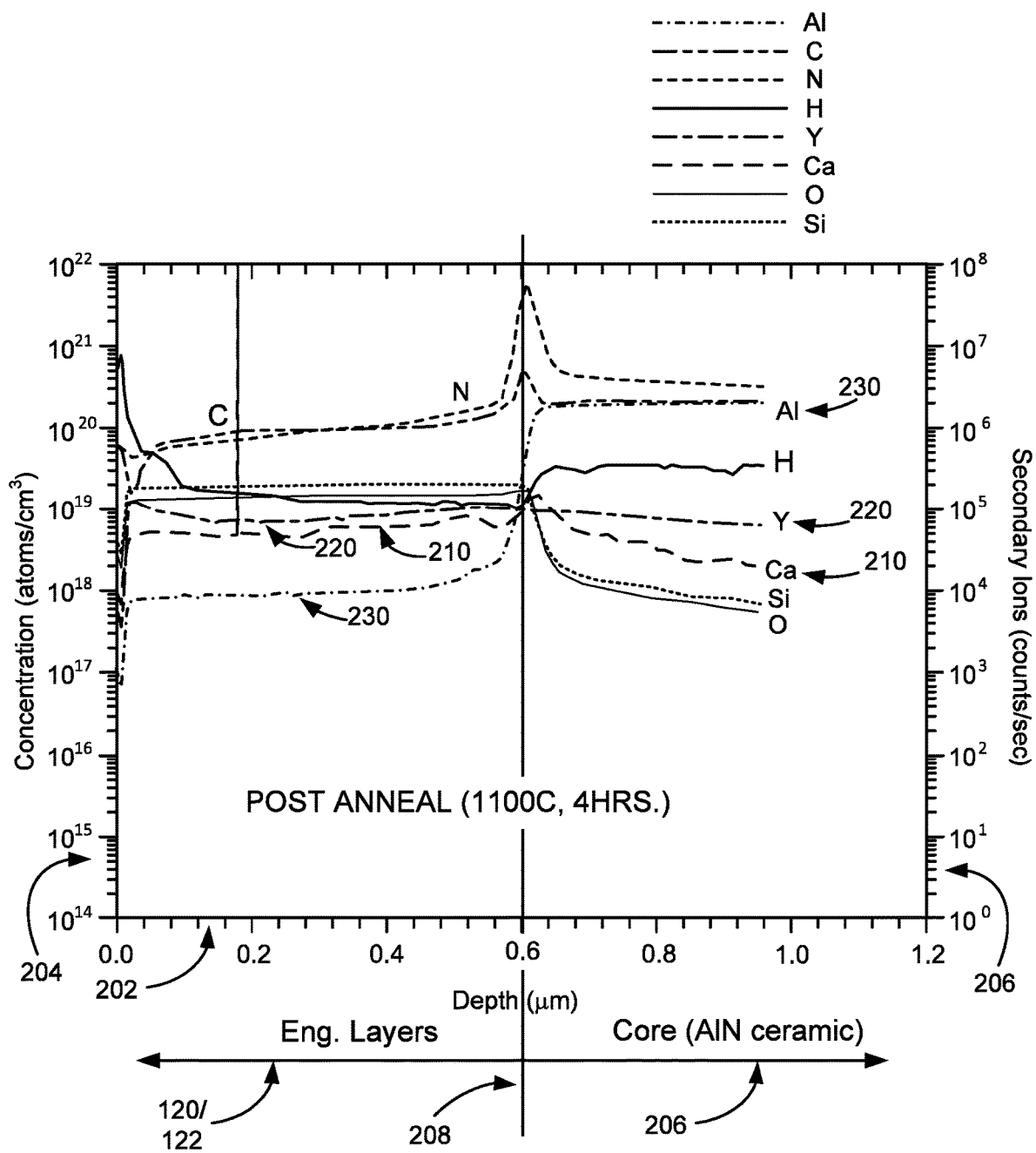
FIG. 2B is a SIMS profile illustrating species concentration as a function of depth for an engineered structure after anneal according to an embodiment of the present invention.

FIG. 2B is a SIMS profile illustrating species concentration as a function of depth for an engineered structure without a barrier layer after anneal according to an embodiment of the present invention. As discussed above, during semiconductor processing operations, the engineered substrate structures provided by embodiments of the present invention can be exposed to high temperatures (~1,100° C.) for several hours, for example, during epitaxial growth of GaN-based layers. For the profile illustrated in FIG. 2B, the engineered substrate structure was annealed at 1,100° C. for a period of four hours. As shown by FIG. 2B, calcium 210, yttrium 220, and aluminum 230, originally present in low concentrations in the engineered layers 120/122, have diffused into the engineered layers 120/122, reaching concentrations similar to other elements.

Accordingly, embodiments of the present invention integrate a barrier layer (e.g., a silicon nitride layer) to prevent out-diffusion of the background elements from the polycrystalline ceramic material (e.g., AlN) into the engineered layers 120/122 and epitaxial material 130 such as the optional GaN layer. The silicon nitride layer encapsulating the underlying layers and material provides the desired barrier layer 118 functionality.

Figure 2C:
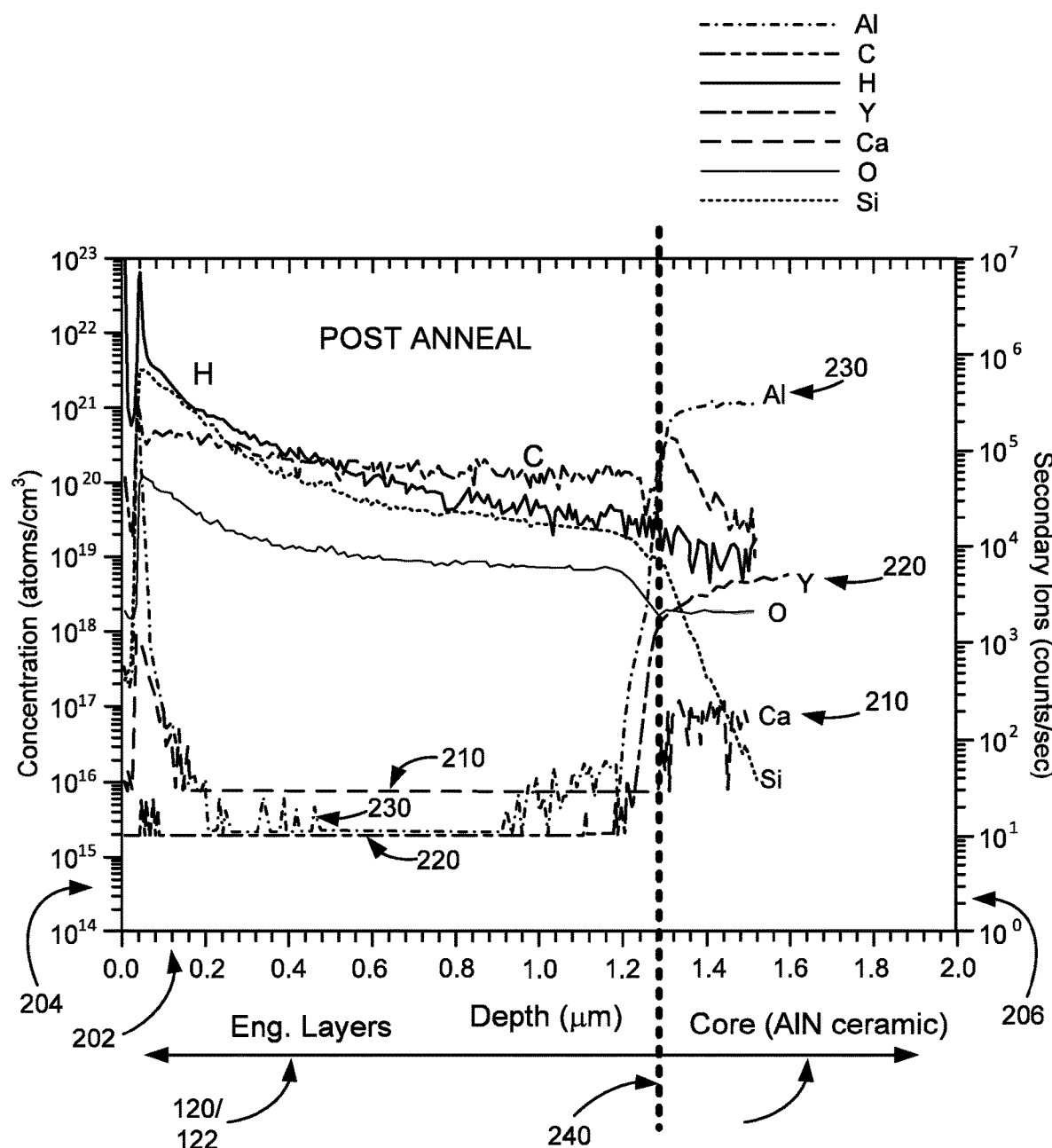
FIG. 2C is a SIMS profile illustrating species concentration as a function of depth for an engineered structure with a silicon nitride layer after anneal according to an embodiment of the present invention.

FIG. 2C is a SIMS profile illustrating species concentration as a function of depth for an engineered structure with a barrier layer 118, represented by dashed-line 240, after anneal according to an embodiment of the present invention. The integration of the diffusion barrier layer 118 (e.g., a silicon nitride layer) into the engineered substrate structure prevents the diffusion of calcium, yttrium, and aluminum into the engineered layers during the annealing process that occurred when the diffusion barrier layer was not present. As illustrated in FIG. 2C, calcium 210, yttrium 220, and aluminum 230 present in the ceramic core remain at low concentrations in the engineered layers post-anneal. Thus, the use of the barrier layer 118 (e.g., a silicon nitride layer) prevents these elements from diffusing through the diffusion barrier and thereby prevents their release into the environment surrounding the engineered substrate. Similarly, any other impurities contained within the bulk ceramic material would be contained by the barrier layer.

Typically, ceramic materials utilized to form the core 110 are fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which are conducted at much lower temperatures in the range of 800° C. to 1,100° C., it would be expected that the subsequent diffusion of these impurities would be insignificant. However, contrary to conventional expectations, the inventors have determined that even during epitaxial growth processes at temperatures much less than the firing temperature of the ceramic materials, significant diffusion of elements through the layers of the engineered substrate was present. Thus, embodiments of the present invention integrate the barrier layer 118 into the engineered substrate 100 to prevent this undesirable diffusion.

Referring once again to FIG. 1, a bonding layer 120 (e.g., a silicon oxide layer) is deposited on a portion of the barrier layer 118, for example, the top surface of the barrier layer, and subsequently used during the bonding of a single crystal layer 122. The bonding layer 120 can be approximately 1.5 μm in thickness in some embodiments. The single crystal layer 122 can include, for example, Si, SiC, sapphire, GaN, AlN, SiGe, Ge, Diamond, $Ga_2O_3$, AlGaN, InGaN, InN, and/or ZnO. In some embodiments, the single crystal layer can have a thickness from 0-0.5 μm. The single crystal layer 122 is suitable for use as a growth layer during an epitaxial growth process for the formation of epitaxial material 130. The crystalline layers of the epitaxial material 130 are an extension of the underlying semiconductor lattice associated with the single crystal layer 122. The unique CTE matching properties of the engineered substrate 100 enable growth of thicker epitaxial material 130 than existing technologies. In some embodiments, the epitaxial material 130 includes a gallium nitride layer, 2 μm to 10 μm in thickness, which can be utilized as one of a plurality of layers utilized in optoelectronic devices, power devices, and the like. In an embodiment, the bonding layer 120 includes a single crystal silicon layer that is attached to a silicon oxide barrier layer 118 using a layer transfer process.

Figure 3:
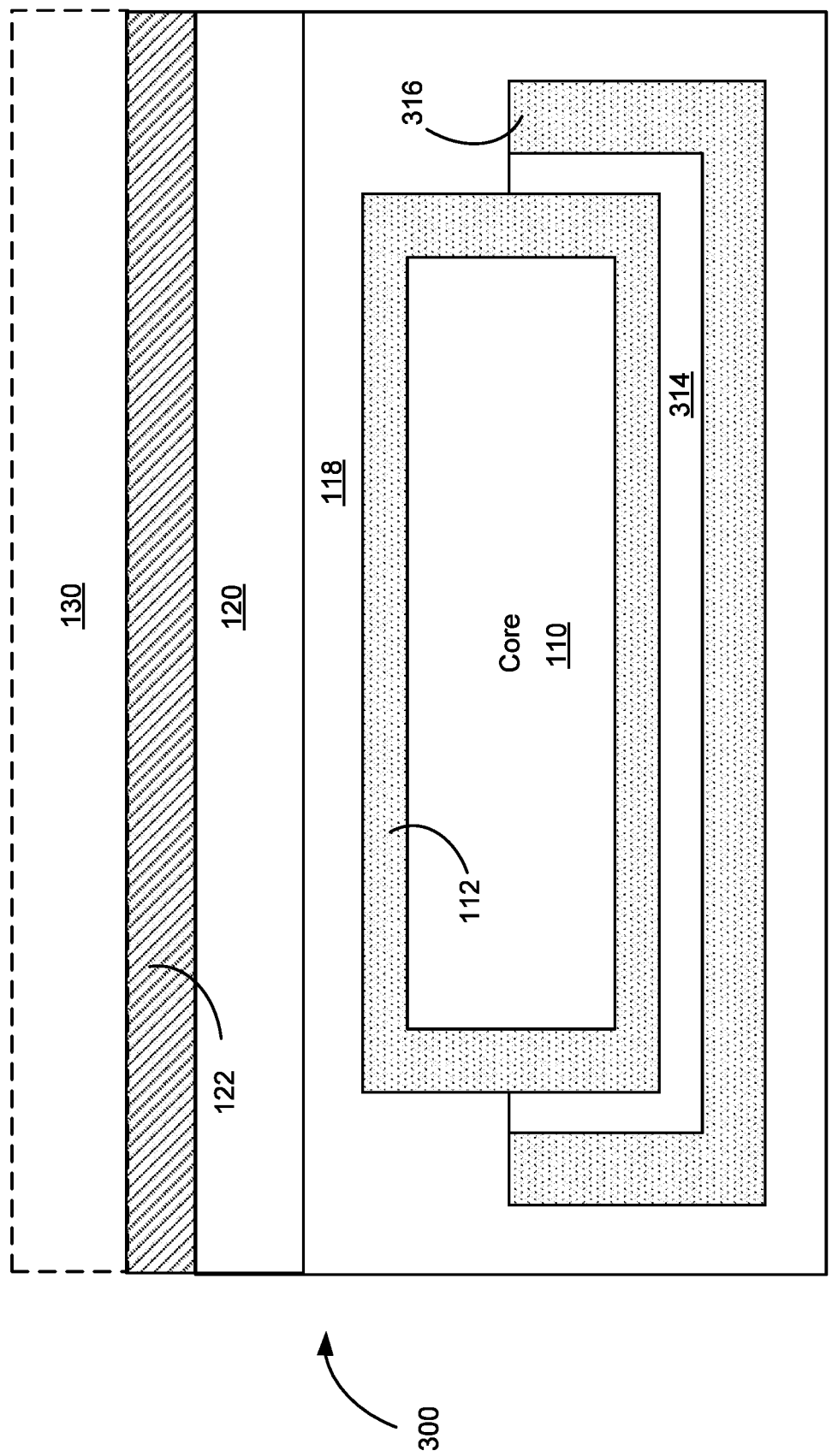
FIG. 3 is a simplified schematic cross-sectional diagram illustrating an engineered substrate structure according to another embodiment of the present invention.

FIG. 3 is a simplified schematic cross-sectional diagram illustrating an engineered substrate structure according to an embodiment of the present invention. The engineered substrate 300 illustrated in FIG. 3 is suitable for a variety of electronic and optical applications. The engineered substrate 300 includes a core 110 that can have a coefficient of thermal expansion (CTE) that is substantially matched to the CTE of the epitaxial material that will be grown on the engineered substrate 300. Epitaxial material 130 is illustrated as optional because it is not required as an element of the engineered substrate structure, but will typically be grown on the engineered substrate structure.

For applications including the growth of gallium nitride (GaN)-based materials (epitaxial layers including GaN-based layers), the core 110 can be a polycrystalline ceramic material, for example, polycrystalline aluminum nitride (AlN). The thickness of the core can be on the order of 100 μm to 1,500 μm, for example, 725 μm. The core 110 is encapsulated in an adhesion layer 112 that can be referred to as a shell or an encapsulating shell. In this implementation, the adhesion layer 112 completely encapsulates the core, but this is not required by the present invention, as discussed in additional detail with respect to FIG. 4.

In an embodiment, the adhesion layer 112 comprises a tetraethyl orthosilicate (TEOS) oxide layer on the order of 1,000 Å in thickness. In other embodiments, the thickness of the adhesion layer varies, for example, from 100 Å to 2,000 Å. Although TEOS oxides are utilized for adhesion layers in some embodiments, other materials that provide for adhesion between later deposited layers and underlying layers or materials can be utilized according to an embodiment of the present invention. For example, $SiO_2$, SiON, and the like adhere well to ceramic materials and provide a suitable surface for subsequent deposition of, for example, conductive materials. The adhesion layer 112 completely surrounds the core 110 in some embodiments to form a fully encapsulated core and can be formed using an LPCVD process. The adhesion layer 112 provides a surface on which subsequent layers adhere to form elements of the engineered substrate structure.

In addition to the use of LPCVD processes, furnace-based processes, and the like to form the encapsulating adhesion layer 112, other semiconductor processes can be utilized according to embodiments of the present invention. As an example, a deposition process, for example, CVD, PECVD, or the like, that coats a portion of the core 110 can be utilized, the core 110 can be flipped over, and the deposition process could be repeated to coat additional portions of the core 110.

A conductive layer 314 is formed on at least a portion of the adhesion layer 112. In an embodiment, the conductive layer 314 includes polysilicon (i.e., polycrystalline silicon) that is formed by a deposition process on a lower portion (e.g., the lower half or backside) of the structure formed by the core 110 and the adhesion layer 112. In embodiments in which the conductive layer 314 is polysilicon, the thickness of the polysilicon layer can be on the order of a few thousand angstroms, for example, 3,000 Å. In some embodiments, the polysilicon layer can be formed using an LPCVD process.

In an embodiment, the conductive layer 314 can be a polysilicon layer doped to provide a highly conductive material, for example, the conductive layer 314 can be doped with boron to provide a P-type polysilicon layer. In some embodiments, the doping with boron is at a level ranging from about $1\times10^{19}$ $cm^{-3}$ to $1\times10^{20}$ $cm^{-3}$ to provide for high conductivity. The presence of the conductive layer 314 is useful during electrostatic chucking of the engineered substrate to semiconductor processing tools, for example tools with electrostatic discharge (ESD) chucks. The conductive layer 314 enables rapid dechucking after processing. Thus, embodiments of the present invention provide substrate structures that can be processed in manners utilized with conventional silicon wafers. One of ordinary skill in the art would recognize many variations, modifications, and alternatives.

A second adhesion layer 316 (e.g., a second TEOS oxide layer) is formed surrounding the conductive layer 314 (e.g., a polysilicon layer). The second adhesion layer 316 is on the order of 1,000 Å in thickness. The second adhesion layer 316 completely surrounds the conductive layer 114 in some embodiments to form a fully encapsulated structure and can be formed using an LPCVD process.

A barrier layer 118 (e.g., a silicon nitride layer) is formed surrounding the second adhesion layer 316. The barrier layer 118 is on the order of 4,000 Å to 5,000 Å in thickness in some embodiments. The barrier layer 118 completely surrounds the second adhesion layer 316 in some embodiments to form a fully encapsulated structure and can be formed using an LPCVD process.

In some embodiments, the use of a barrier layer 118 that includes silicon nitride prevents diffusion and/or outgassing of elements present in the core 110 into the environment of the semiconductor processing chambers in which the engineered substrate could be present, for example, during a high temperature (e.g., 1,000° C.) epitaxial growth process. Elements present in the core include, for example, yttrium oxide (i.e., yttria), oxygen, metallic impurities, other trace elements and the like. Utilizing the encapsulating layers described herein, ceramic materials, including polycrystalline AlN, that are designed for non-clean room environments can be utilized in semiconductor process flows and clean room environments.

In some embodiments, the engineered substrate 100 can be compliant with Semiconductor Equipment and Materials International (SEMI) standard specifications. Because the engineered substrate 100 can be compliant with SEMI specifications, the engineered substrate 100 can be used with existing semiconductor fabrication tools. For example, wafer diameter for the engineered substrate can be 4-inch, 6-inch, or 8-inch. In some embodiments, an 8-inch engineered substrate wafer can be 725-750 μm in thickness. In contrast, current silicon substrates used to manufacture epitaxial gallium nitride layers are not compliant with SEMI specifications because the silicon substrates are 1050-1500 μm in thickness. As a result of the non-compliance, silicon substrates of standard wafer diameters cannot be used in equipment that complies with SEMI specifications to grow GaN based devices.

Figure 4:
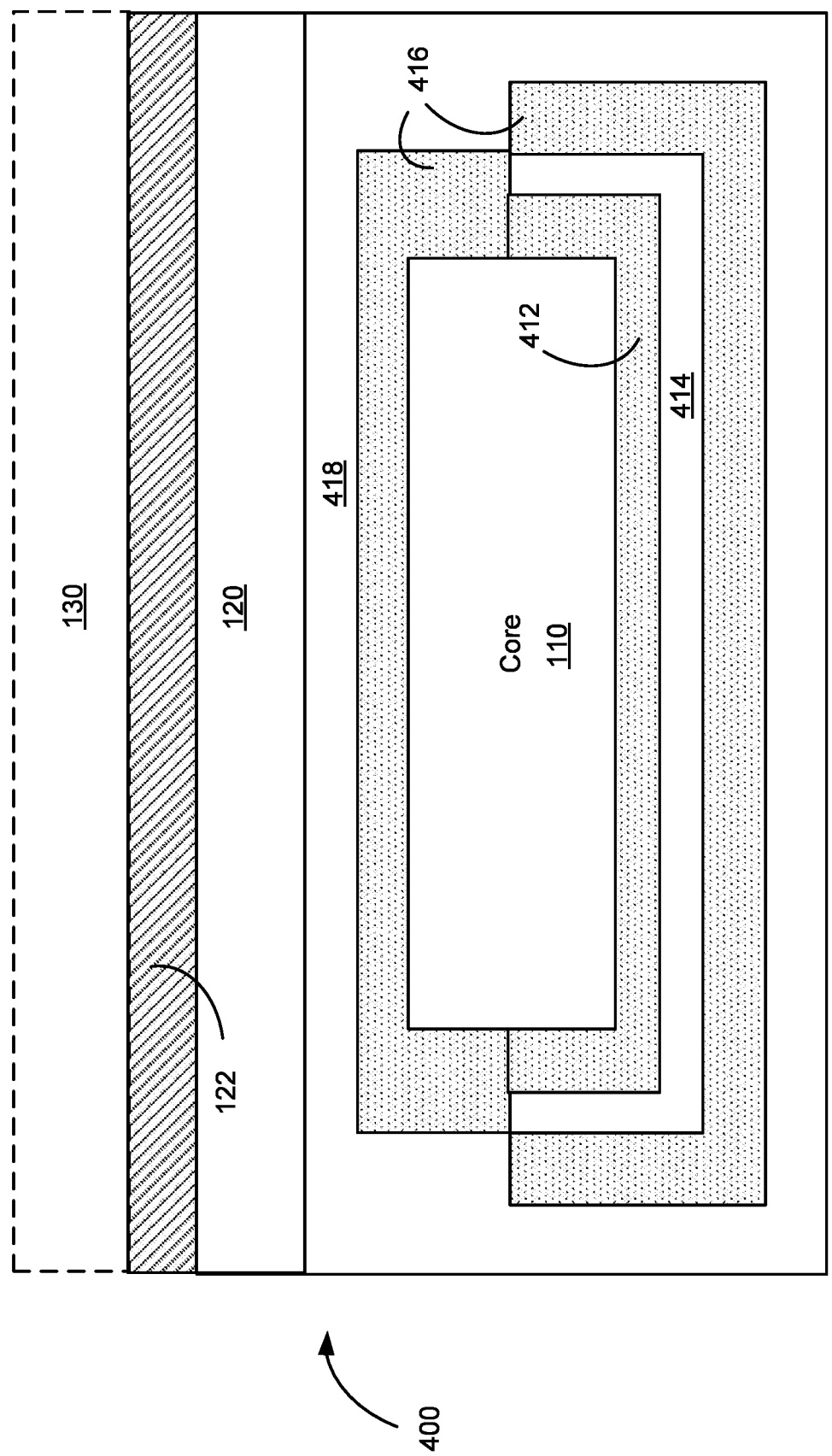
FIG. 4 is a simplified schematic cross-sectional diagram illustrating an engineered substrate structure according to yet another embodiment of the present invention.

FIG. 4 is a simplified schematic cross-sectional diagram illustrating an engineered substrate structure 400 according to another embodiment of the present invention. In the embodiment illustrated in FIG. 4, the adhesion layer 412 is formed on at least a portion of the core 110 but does not encapsulate the core 110. In this implementation, the adhesion layer 412 is formed on a lower surface of the core (the backside of the core) in order to enhance the adhesion of a subsequently formed conductive layer 414 as described more fully below. Although adhesion layer 412 is only illustrated on the lower surface of the core in FIG. 4, it will be appreciated that deposition of adhesion layer material on other portions of the core will not adversely affect the performance of the engineered substrates structure and such material can be present in various embodiments. One of ordinary skill in the art would recognize many variations, modifications, and alternatives.

The conductive layer 414, rather than being formed as a shell as illustrated in FIG. 3, does not encapsulate the adhesion layer 412 and core 110, but is substantially aligned with the adhesion layer 412. Although the conductive layer 414 is illustrated as extending along the bottom or backside and up a portion of the sides of the adhesion layer 412, this is not required by the present invention. Thus, embodiments can utilize deposition on one side of the substrate structure, masking of one side of the substrate structure, or the like. The conductive layer 414 can be formed on a portion of one side, for example, the bottom/backside, of the adhesion layer 412. The conductive layer 414 provides for electrical conduction on one side of the engineered substrate structure 400, which can be advantageous in RF and high power applications. The conductive layer 414 can include doped polysilicon as discussed in relation to conductive layer 114 in FIG. 1. In addition to semiconductor-based conductive layers, in other embodiments, the conductive layer 414 is a metallic layer, for example, 500 Å of titanium, or the like.

Portions of the core 110, portions of the adhesion layer 412, and the conductive layer 414 are covered with a second adhesion layer 416 in order to enhance the adhesion of the barrier layer 418 to the underlying materials. The barrier layer 418 forms an encapsulating structure to prevent diffusion from underlying layers as discussed above in relation to FIGS. 2A, 2B, and 2C.

Referring once again to FIG. 4, depending on the implementation, one or more layers may be removed. For example, the adhesion layer 412 and the conductive layer 414 can be removed, leaving only single adhesion shell 416 and barrier layer 418. In another embodiment, only the conductive layer 414 can be removed, leaving single adhesion layer 412 underneath the barrier layer 418. In this embodiment, adhesion layer 412 may also balance the stress and the wafer bow induced by bonding layer 120, deposited on top of barrier layer 418. The construction of a substrate structure with insulating layers on the top side of core 110 (e.g., with only insulating layer between core 110 and bonding layer 120) will provide benefits for power/RF applications, where a highly insulating substrate is desirable.

In another embodiment, barrier layer 418 may directly encapsulate core 110, followed by conductive layer 414 and subsequent adhesion layer 416. In this embodiment, bonding layer 120 may be directly deposited onto adhesion layer 416 from the top side. In yet another embodiment, adhesion layer 416 may be deposited on core 110, followed by a barrier layer 418, and then followed by conductive layer 414, and another adhesion layer 412.

Although some embodiments have been discussed in terms of a layer, the term layer should be understood such that a layer can include a number of sub-layers that are built up to form the layer of interest. Thus, the term layer is not intended to denote a single layer consisting of a single material, but to encompass one or more materials layered in a composite manner to form the desired structure. One of ordinary skill in the art would recognize many variations, modifications, and alternatives.

Figure 5:
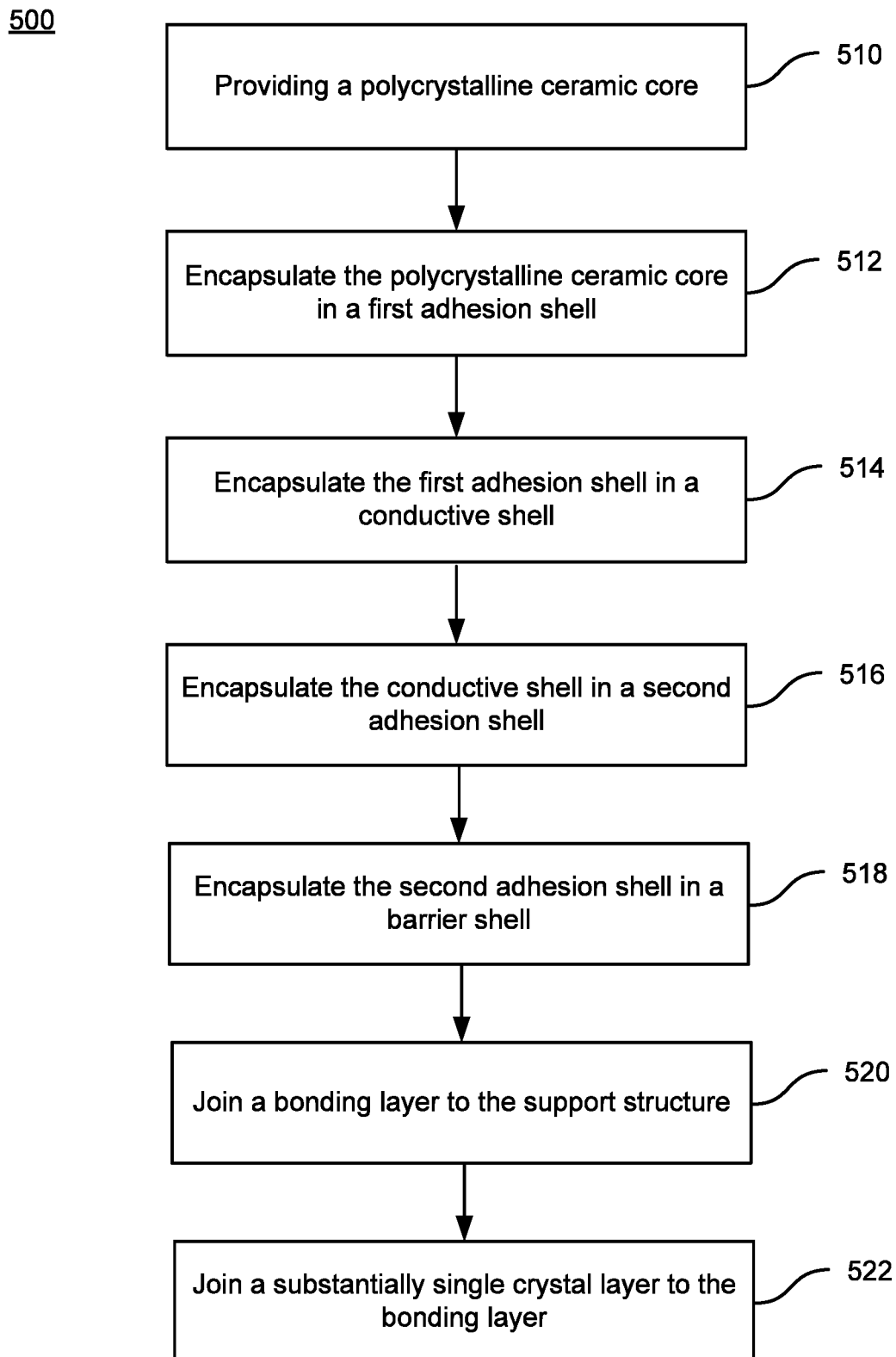
FIG. 5 is a simplified flowchart illustrating a method of fabricating an engineered substrate according to an embodiment of the present invention.

FIG. 5 is a simplified flowchart illustrating a method of fabricating an engineered substrate according to an embodiment of the present invention. The method can be utilized to manufacture a substrate that is CTE matched to one or more of the epitaxial layers grown on the substrate. The method 500 includes forming a support structure by providing a polycrystalline ceramic core (510), encapsulating the polycrystalline ceramic core in a first adhesion layer forming a shell (512) (e.g., a tetraethyl orthosilicate (TEOS) oxide shell), and encapsulating the first adhesion layer in a conductive shell (514) (e.g., a polysilicon shell). The first adhesion layer can be formed as a single layer of TEOS oxide. The conductive shell can be formed as a single layer of polysilicon.

The method also includes encapsulating the conductive shell in a second adhesion layer (516) (e.g., a second TEOS oxide shell) and encapsulating the second adhesion layer in a barrier layer shell (518). The second adhesion layer can be formed as a single layer of TEOS oxide. The barrier layer shell can be formed as a single layer of silicon nitride.

Once the support structure is formed by processes 510-518, the method further includes joining a bonding layer (e.g., a silicon oxide layer) to the support structure (520) and joining a substantially single crystal layer, for example, a single crystal silicon layer, to the silicon oxide layer (522). Other substantially single crystal layers can be used according to embodiments of the present invention, including SiC, sapphire, GaN, AlN, SiGe, Ge, Diamond, $Ga_2O_3$, ZnO, and the like. The joining of the bonding layer can include deposition of a bonding material followed by planarization processes as described herein. In an embodiment as described below, joining the substantially single crystal layer (e.g., a single crystal silicon layer) to the bonding layer utilizes a layer transfer process in which the layer is a single crystal silicon layer that is transferred from a silicon wafer.

Referring to FIG. 1, the bonding layer 120 can be formed by a deposition of a thick (e.g., 4 μm thick) oxide layer followed by a chemical mechanical polishing (CMP) process to thin the oxide to approximately 1.5 μm in thickness. The thick initial oxide serves to fill voids and surface features present on the support structure that may be present after fabrication of the polycrystalline core and continue to be present as the encapsulating layers illustrated in FIG. 1 are formed. The oxide layer also serves as a dielectric layer for the devices. The CMP process provides a substantially planar surface free of voids, particles, or other features, which can then be used during a wafer transfer process to bond the single crystal layer 122 (e.g., a single crystal silicon layer) to the bonding layer 120. It will be appreciated that the bonding layer does not have to be characterized by an atomically flat surface, but should provide a substantially planar surface that will support bonding of the single crystal layer (e.g., a single crystal silicon layer) with the desired reliability.

A layer transfer process is used to join the single crystal layer 122 (e.g., a single crystal silicon layer) to the bonding layer 120. In some embodiments, a silicon wafer including the substantially single crystal layer 122 (e.g., a single crystal silicon layer) is implanted to form a cleavage plane. In this embodiment, after wafer bonding, the silicon substrate can be removed along with the portion of the single crystal silicon layer below the cleavage plane, resulting in an exfoliated single crystal silicon layer. The thickness of the single crystal layer 122 can be varied to meet the specifications of various applications. Moreover, the crystal orientation of the single crystal layer 122 can be varied to meet the specifications of the application. Additionally, the doping levels and profile in the single crystal layer can be varied to meet the specifications of the particular application. In some embodiments, the depth of the implant may be adjusted to be greater than the desired final thickness of single crystal layer 122. The additional thickness allows for the removal of the thin portion of the transferred substantially single crystal layer that is damaged, leaving behind the undamaged portion of the desired final thickness. In some embodiments, the surface roughness can be modified for high quality epitaxial growth. One of ordinary skill in the art would recognize many variations, modifications, and alternatives.

In some embodiments, the single crystal layer 122 can be thick enough to provide a high quality lattice template for the subsequent growth of one or more epitaxial layers but thin enough to be highly compliant. The single crystal layer 122 may be said to be "compliant" when the single crystal layer 122 is relatively thin such that its physical properties are less constrained and able to mimic those of the materials surrounding it with less propensity to generate crystalline defects. The compliance of the single crystal layer 122 may be inversely related to the thickness of the single crystal layer 122. A higher compliance can result in lower defect densities in the epitaxial layers grown on the template and enable thicker epitaxial layer growth. In some embodiments, the thickness of the single crystal layer 122 may be increased by epitaxial growth of silicon on the exfoliated silicon layer.

In some embodiments, adjusting the final thickness of the single crystal layer 122 may be achieved through thermal oxidation of a top portion of an exfoliated silicon layer, followed by an oxide layer strip with hydrogen fluoride (HF) acid. For example, an exfoliated silicon layer having an initial thickness of 0.5 µm may be thermally oxidized to create a silicon dioxide layer that is about 420 nm thick. After removal of the grown thermal oxide, the remaining silicon thickness in the transferred layer may be about 53 nm. During thermal oxidation, implanted hydrogen may migrate toward the surface. Thus, the subsequent oxide layer strip may remove some damage. Also, thermal oxidation is typically performed at a temperature of 1000° C. or higher. The elevated temperature can may also repair lattice damage.

The silicon oxide layer formed on the top portion of the single crystal layer during thermal oxidation can be stripped using HF acid etching. The etching selectivity between silicon oxide and silicon ($SiO_2$:Si) by HF acid may be adjusted by adjusting the temperature and concentration of the HF solution and the stoichiometry and density of the silicon oxide. Etch selectivity refers to the etch rate of one material relative to another. The selectivity of the HF solution can range from about 10:1 to about 100:1 for ($SiO_2$:Si). A high etch selectivity may reduce the surface roughness by a similar factor from the initial surface roughness. However, the surface roughness of the resultant single crystal layer 122 may still be larger than desired. For example, a bulk Si (111) surface may have a root-mean-square (RMS) surface roughness of less than 0.1 nm as determined by a 2 µm×2 µm atomic force microscope (AFM) scan before additional processing. In some embodiments, the desired surface roughness for epitaxial growth of gallium nitride materials on Si (111) may be, for example, less than 1 nm, less than 0.5 nm, or less than 0.2 nm, on a 30 µm×30 µm AFM scan area.

If the surface roughness of the single crystal layer 122 after thermal oxidation and oxide layer strip exceeds the desired surface roughness, additional surface smoothing may be performed. There are several methods of smoothing a silicon surface. These methods may include hydrogen annealing, laser trimming, plasma smoothing, and touch polish (e.g., CMP). These methods may involve preferential attack of high aspect ratio surface peaks. Hence, high aspect ratio features on the surface may be removed more quickly than low aspect ratio features, thus resulting in a smoother surface.

It should be appreciated that the specific steps illustrated in FIG. 5 provide a particular method of fabricating an engineered substrate according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 6:
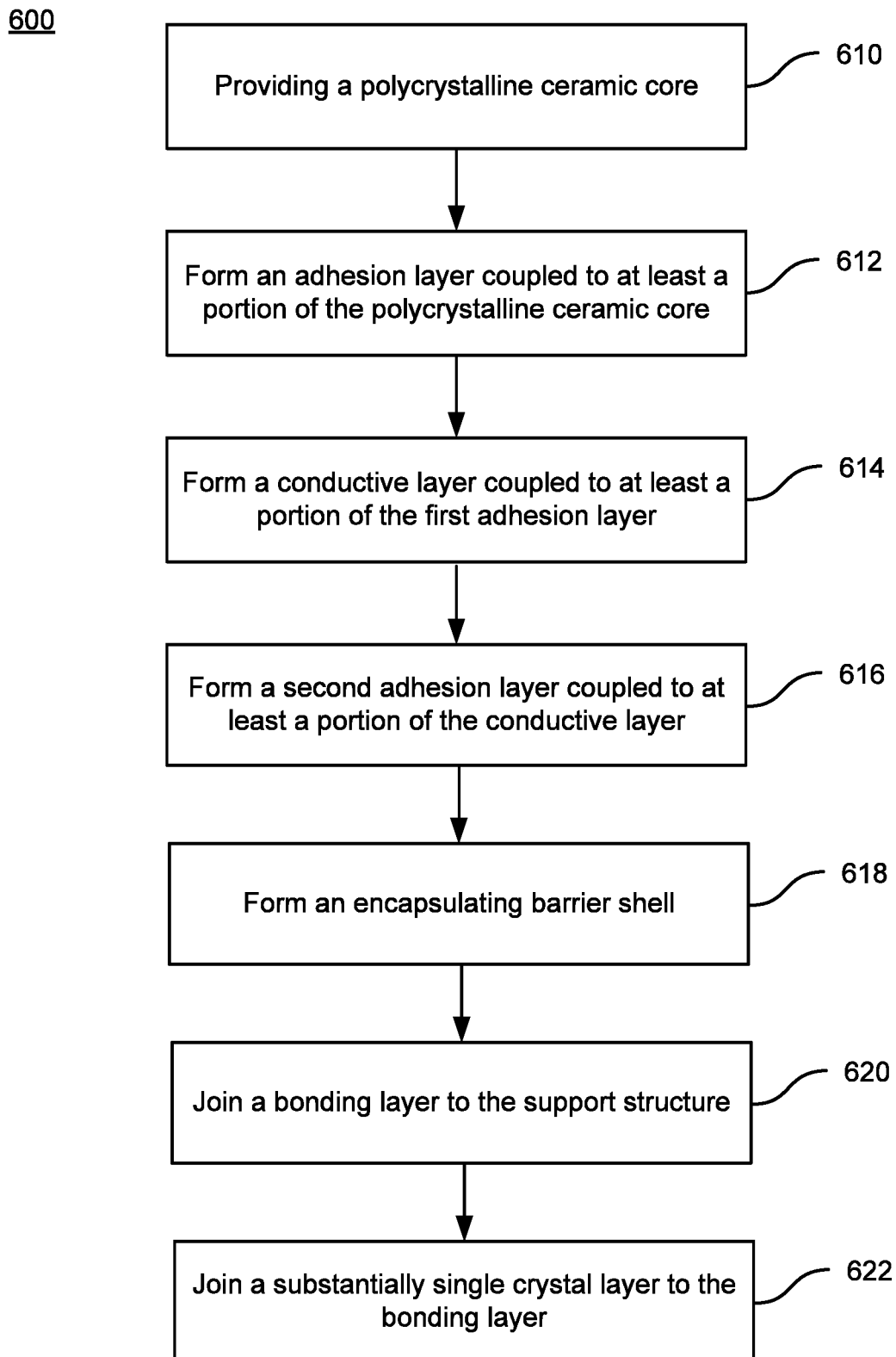
FIG. 6 is a simplified flowchart illustrating a method of fabricating an engineered substrate according to another embodiment of the present invention.

FIG. 6 is a simplified flowchart illustrating a method of fabricating an engineered substrate according to another embodiment of the present invention. The method includes forming a support structure by providing a polycrystalline ceramic core (610), forming an adhesion layer coupled to at least a portion of the polycrystalline ceramic core (612). The first adhesion layer can include a tetraethyl orthosilicate (TEOS) oxide layer. The first adhesion layer can be formed as a single layer of TEOS oxide. The method also includes forming a conductive layer coupled to the first adhesion layer (614). The conductive layer can be a polysilicon layer. The conductive layer can be formed as a single layer of polysilicon.

The method also includes forming a second adhesion layer coupled to at least a portion of the first adhesion layer (616) and forming a barrier shell (618). The second adhesion layer can be formed as a single layer of TEOS oxide. The barrier shell can be formed as a single layer of silicon nitride or a series of sub-layers forming the barrier shell.

Once the support structure is formed by processes 610-618, the method further includes joining a bonding layer (e.g., a silicon oxide layer) to the support structure (620) and joining a single crystal silicon layer or a substantially single crystal layer to the silicon oxide layer (622). The joining of the bonding layer can include deposition of a bonding material followed by planarization processes as described herein. In an embodiment as described below, joining the single crystal layer (e.g., a single crystal silicon layer) to the bonding layer utilizes a layer transfer process in which the single crystal silicon layer is transferred from a silicon wafer.

It should be appreciated that the specific steps illustrated in FIG. 6 provide a particular method of fabricating an engineered substrate according to another embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7:
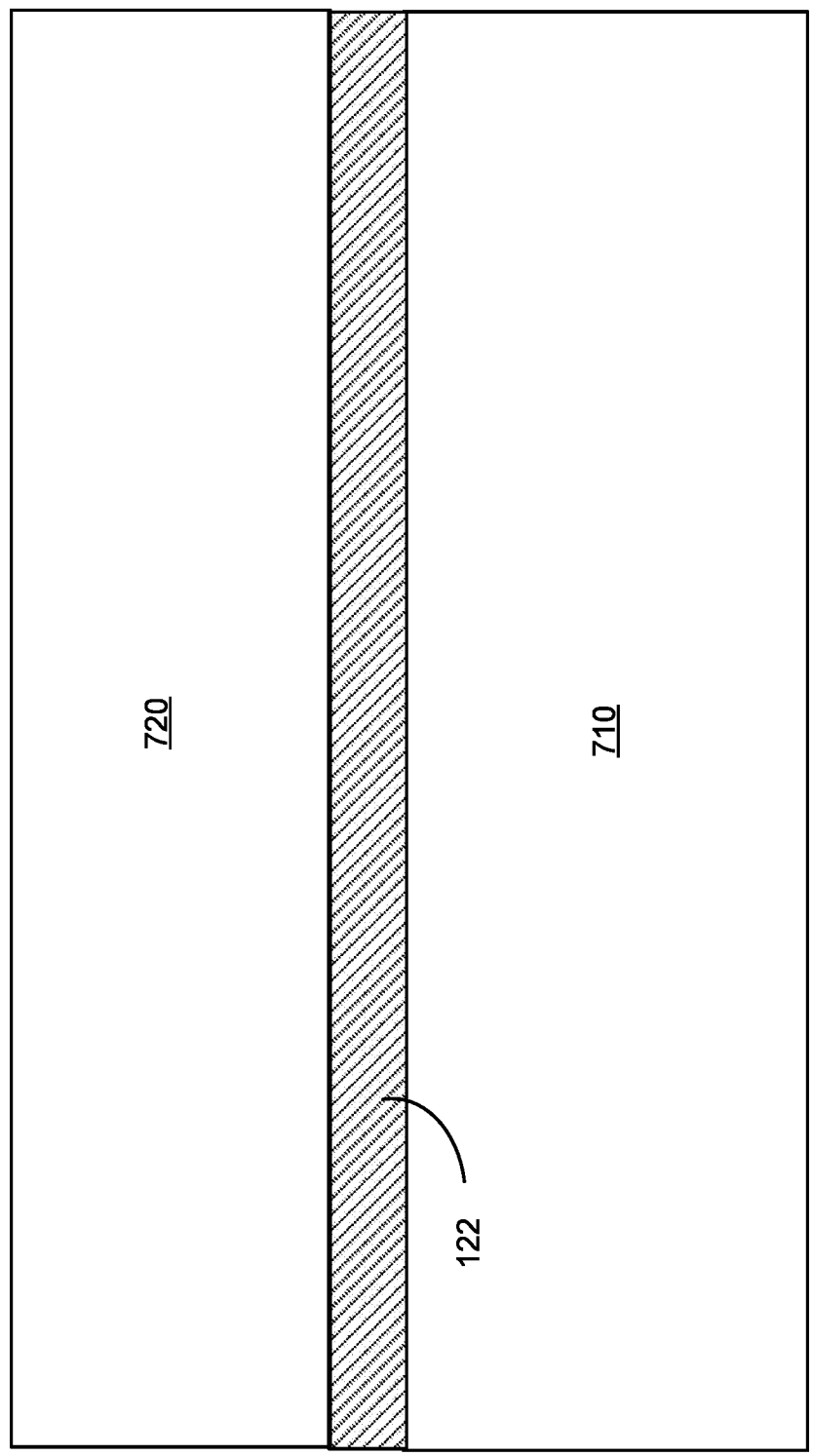
FIG. 7 is a simplified schematic cross-sectional diagram illustrating an epitaxial/engineered substrate structure for RF and power applications according to an embodiment of the present invention.

FIG. 7 is a simplified schematic cross-sectional diagram illustrating an epitaxial/engineered substrate structure 700 for RF and power applications according to an embodiment of the present invention. In some LED applications, the engineered substrate structure provides a growth substrate that enables the growth of high quality GaN layers and the engineered substrate structure is subsequently removed.

However, for RF and power device applications, the engineered substrate structure forms portions of the finished device and as a result, the electrical, thermal, and other properties of the engineered substrate structure or elements of the engineered substrate structure are important to the particular application.

Referring to FIG. 1, the single crystal layer 122 can be an exfoliated single crystal silicon layer split from a silicon donor wafer using an implant and exfoliation technique. Typical implants are hydrogen and boron. For power and RF device applications, the electrical properties of the layers and materials in the engineered substrate structure are of importance. For example, some device architectures utilize highly insulating silicon layers with resistance greater than 103 Ohm-cm to reduce or eliminate leakage through the substrate and interface layers. Other applications utilized designs that include a conductive silicon layer of a predetermined thickness (e.g., 1 µm) in order to connect the source of the device to other elements. Thus, in these applications, control of the dimensions and properties of the single crystal silicon layer is desirable. In design in which implant and exfoliation techniques are used during layer transfer, residual implant atoms, for example, hydrogen or boron, are present in the silicon layer, thereby altering the electrical properties. Additionally, it can be difficult to control the thickness, conductivity, and other properties of thin silicon layers, using, for example, adjustments in the implant dose, which can affect conductivity, and implant depth, which can affect layer thickness.

According to embodiments of the present invention, silicon epitaxy on an engineered substrate structure is utilized to achieve desired properties for the single crystal silicon layer as appropriate to particular device designs.

Referring to FIG. 7, the epitaxial/engineered substrate structure 700 includes an engineered substrate structure 710 and an epitaxial single crystal layer 720 formed thereon. In some embodiments, the epitaxial single crystal layer 720 can be a single crystal silicon layer. The engineered substrate structure 710 can be similar to the engineered substrate structures illustrated in FIGS. 1, 3, and 4. Typically, the single crystal layer 122 (for example, a single crystal silicon layer) is on the order of 0.5 µm after layer transfer. Surface conditioning processes can be utilized to reduce the thickness of the single crystal layer 122 to about 0.3 µm in some processes. In order to increase the thickness of the single crystal layer 122 to about 1 µm for use in making reliable ohmic contacts, for example, an epitaxial process is used to grow epitaxial single crystal layer 720 on the single crystal layer 122 formed by the layer transfer process. A variety of epitaxial growth processes can be used to grow epitaxial single crystal layer 720, including atomic layer deposition (ALD), CVD, LPCVD, MBE, or the like. The epitaxial single crystal layer 720 can include, for example, Si, SiC, sapphire, GaN, AlN, SiGe, Ge, Diamond, $Ga_2O_3$, and/or ZnO. The thickness of the epitaxial single crystal layer 720 can range from about 0.1 µm to about 20 µm, for example between 0.1 µm and 10 µm.

Figure 8A:
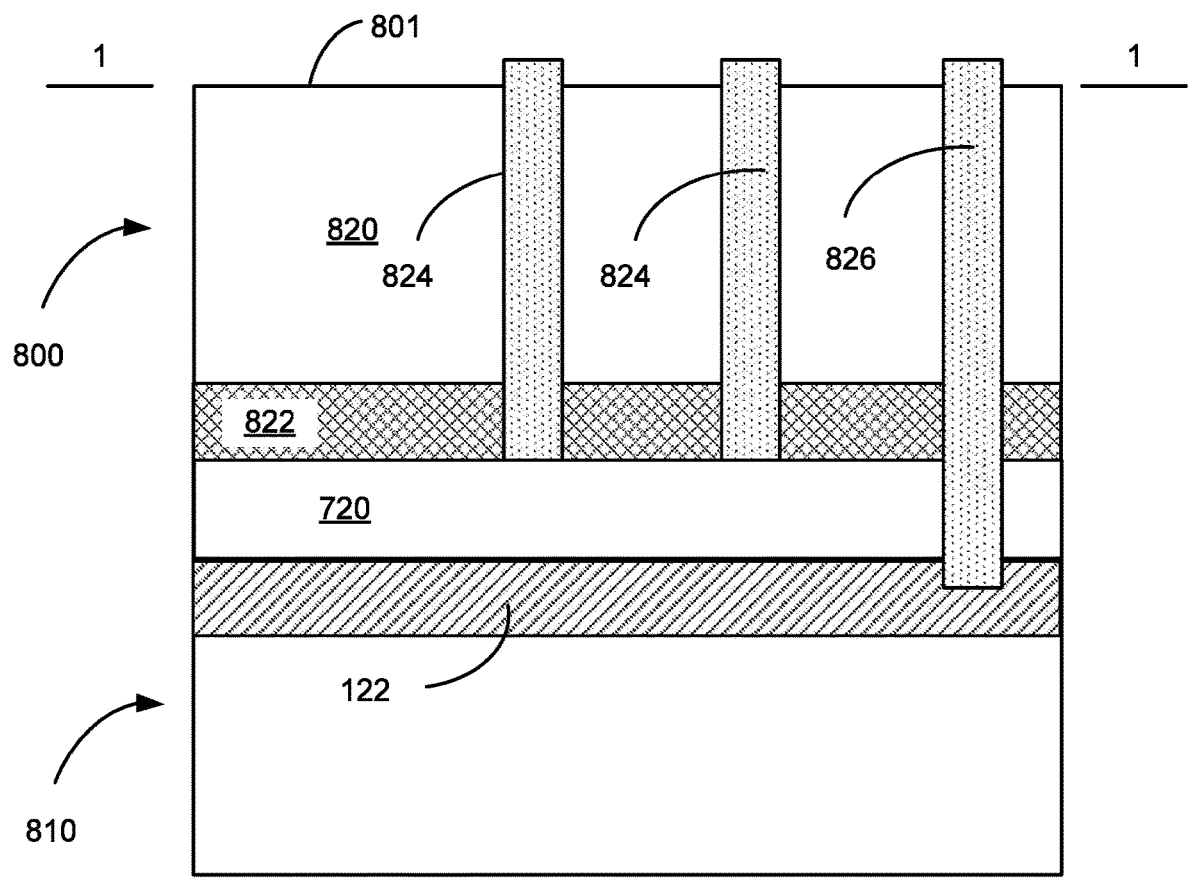
FIG. 8A is a simplified schematic diagram illustrating a III-V epitaxial layer on an engineered substrate structure according to an embodiment of the present invention.

FIG. 8A is a simplified schematic cross-sectional diagram illustrating a III-V epitaxial layer on an engineered substrate structure according to an embodiment of the present invention. The structure illustrated in FIG. 8A can be referred to as a double epitaxial structure 800 as described below. As illustrated in FIG. 8A, an engineered substrate structure 810 including an epitaxial single crystal layer 720 has a III-V epitaxial layer 820 formed thereon. In an embodiment, the III-V epitaxial layer comprises gallium nitride (GaN). In order to provide for electrical conductivity between portions of the III-V epitaxial layer, which can include multiple sub-layers, a set of vias 824 are formed passing, in this example, from a top surface 801 of the III-V epitaxial layer 820, into the epitaxial single crystal layer 720. FIG. 8A shows the vias 824 extending through the epitaxial layer 820 to the epitaxial single crystal layer 720. As an example, these vias could be used to connect an electrode of a diode or a transistor to the underlying layer by providing an ohmic contact through the vias 824, thereby relaxing charge build up in the device. In some embodiments, one or more vias 824 may be insulated on its side wall so that it is not electrically connected to the III-V epitaxial layer 820. The electrical contact may facilitate the removal of parasitic charges, thereby enabling faster switching of the power device.

In some embodiments, the via 826 can extend to the single crystal layer 122. In order to address the difficulty of fabricating the via 826 to contact the single crystal layer 122, additional conducting epitaxial layers 822 can be grown on the single crystal layer 122 and single crystal layer 720 to increase the size of a target conducting layer for the via 826, that is, the thickness of the layer in which the via terminates. Epitaxial single crystal layer 720 and epitaxial III-V layers 820 can be formed thicker than on conventional substrates because of the unique CTE and diffusion properties of the engineered substrate structure 810. Therefore, existing substrate technologies cannot support the growth of enough defect free epitaxial layers to include conducting epitaxial layers 822 in a device. In some embodiments, the conducting epitaxial layers 822 can be AlN, AlGaN, GaN or a sufficiently doped semiconductor material. In particular embodiments, the thickness of the conducting epitaxial layers 822 can be 0.1-10 µm. In other embodiments, the thickness of the conducting epitaxial layers 822 can vary depending on the semiconductor device requirements. In some embodiments, the engineered substrate structure and the single crystal layer 122 can be removed, exposing the epitaxial single crystal layer 720 and or the conducting epitaxial layers 822. A contact can be formed on the exposed epitaxial layers after substrate removal. One of ordinary skill in the art would recognize many variations, modifications, and alternatives.

In some embodiments, the III-V epitaxial layer can be grown on the single crystal layer 122. In order to terminate the vias in the single crystal layer 122, an ohmic contact using the vias can be made in a 0.3 µm single crystal layer across an entire wafer. Utilizing embodiments of the present invention, it is possible to provide single crystal layers multiple microns in thickness. Multiple micron thickness is difficult to achieve using implant and exfoliation processes since large implant depth requires high implant energy. In turn, the thick epitaxial single crystal layers described herein enable applications such as the illustrated vias that enable a wide variety of device designs.

In addition to increasing the thickness of the "layer" by epitaxially growing the epitaxial single crystal layer 720 on the single crystal layer 122, other adjustments can be made to the original properties of the single crystal layer 122, including modifications of the conductivity, crystallinity, and the like. For example, if a silicon layer on the order of 10 µm is desired before additional epitaxial growth of III-V layers or other materials, such a thick layer can be grown according to embodiments of the present invention.

The implant process can impact the properties of the single crystal layer 122, for example, residual boron/hydrogen atoms can cause defects that influence the electrical properties of a silicon crystal layer. In some embodiments of the present invention, a portion of the single crystal layer 122 can be removed prior to epitaxial growth of the epitaxial single crystal layer 720. For example, a single crystal silicon layer can be thinned to form a layer 0.1 μm in thickness or less, removing most or all of the residual boron/hydrogen atoms. Subsequent growth of a single crystal silicon layer is then used to provide a single crystal material with electrical and/or other properties substantially independent of the corresponding properties of the layer formed using layer transfer processes.

In addition to increasing the thickness of the single crystal silicon material coupled to the engineered substrate structure, the electrical properties, including the conductivity of the epitaxial single crystal layer 720, can be different from that of the single crystal layer 122. Doping of the epitaxial single crystal layer 720 during growth can produce P-type silicon by doping with boron and N-type silicon by doping with phosphorus. Undoped silicon can be grown to provide high resistivity silicon used in devices that have insulating regions. Insulating layers can be of use in RF devices, in particular.

The lattice constant of the epitaxial single crystal layer 720 can be adjusted during growth to vary from the lattice constant of the single crystal layer 122 to produce strained epitaxial material. In addition to silicon, other elements can be grown epitaxially to provide layers, including strained layers, that include silicon germanium, or the like. Additionally, the crystal orientation of the crystal planes, for example growth of (111) silicon on (100) silicon, can be utilized to introduce strain. For instance, buffer layers can be grown on the single crystal layer 122, on the epitaxial single crystal layer 720, or between layers, to enhance subsequent epitaxial growth. These buffer layers could include III-V semiconductor material layers such as aluminum gallium nitride, indium gallium nitride, and indium aluminum gallium nitride, silicon germanium strained layers, and the like. The strain of the III-V semiconductor material layers can be adjusted for desired material properties. Additionally, the buffer layers and other epitaxial layers can be graded in mole fraction, dopants, polarity, or the like. One of ordinary skill in the art would recognize many variations, modifications, and alternatives.

In some embodiments, strain present in the single crystal layer 122 or the epitaxial single crystal layer 720 may be relaxed during growth of subsequent epitaxial layers, including epitaxial III-V layers.

Figure 8B:
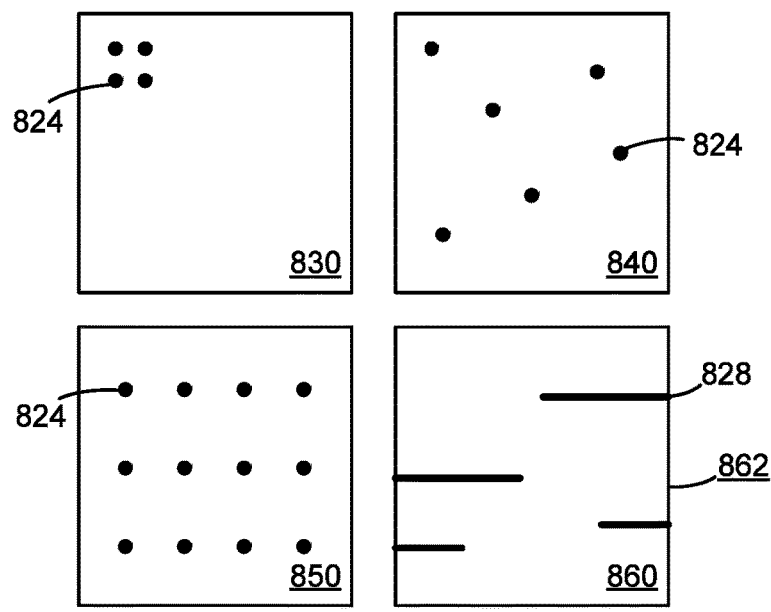
FIG. 8B is a simplified schematic plan view illustrating via configurations for a semiconductor device formed on an engineered substrate according to another embodiment of the present invention.

FIG. 8B is a simplified schematic plan view diagram illustrating four double epitaxial structures according to an embodiment of the present invention. The double epitaxial structures illustrated in FIG. 8B each include a set of vias 824. A first double epitaxial structure 830 shows a tight via configuration. A second double epitaxial structure 840 shows a dispersed via configuration. The dispersed via configuration uses vias 824 in active regions of the device more likely to experience charge build up. A third double epitaxial structure 850 shows a patterned via configuration. The patterned via configuration can space vias 824 equal distances across the double epitaxial structure 850. A fourth double epitaxial structure 860 illustrates lateral vias 828. Lateral vias 828 can be fabricated to travel substantially parallel to the epitaxial layers of the double epitaxial structure 860 and contact the single crystal layer 122 at, for example, an edge 862. One of ordinary skill in the art would recognize many variations, modifications, and alternatives.

The engineered substrates as described above may afford epitaxial growth of gallium nitride device layers thereon that are substantially lattice matched to the engineered substrates and are characterized by a coefficient of thermal expansion (CTE) that is substantially matched to that of the engineered substrates. Thus, engineered substrates may provide superior thermal stability and shape control. The engineered substrates may also enable wafer diameter scaling with reuse capability. Relatively thick (e.g., greater than 20 μm) high quality epitaxial gallium nitride layers may be formed on the engineered substrates that are crack free and characterized by low defect density and low post-epitaxial bow and stress. Multiple applications, such as power devices, radio frequency (RF) devices, monolithic microwave integrated circuits (MMICs), displays, light-emitting diodes (LEDs), and the like, may be implemented on a single platform. Such engineered substrates may also be suitable for various device architectures, such as lateral devices, vertical devices, chip scale package (CSP) devices, and the like.

Gallium nitride (GaN) and similar wide bandgap semiconductor materials offer physical properties superior to those of silicon, which allow for power semiconductor devices based on these materials to withstand high voltages and temperatures. These properties also permit higher frequency response, greater current density and faster switching. The continuous drive for greater power density at the device and package levels creates consequences in terms of higher temperatures and temperature gradients across the package. Using engineered substrates for forming CTE-matched epitaxial device layers may alleviate many thermal-related failure mechanisms common for wide bandgap devices, as described below.

Compound semiconductor devices, such as gallium nitride (GaN) based high electron mobility transistors (HEMTs), may be subjected to high electric fields and high currents (e.g., large signal RF), while being driven into deep saturation. Contact degradation, inverse piezoelectric effects, hot electron effects, and self-heating are among some of the common problems. For example, Schottky and ohmic contacts may show an increase in contact resistance and exhibit passivation cracking for temperatures greater than about 300° C. Inter-diffusion within the gate metal stack and gallium out-diffusion into the metal layers may occur. Hot electron effects may occur when electrons accelerated in a large electric field gain very high kinetic energy. The hot electron effect may lead to trap formation in aluminum gallium nitride (AlGaN) layers, at AlGaN/GaN interfaces, at passivation layer/GaN cap layer interfaces, and in buffer layers.

Trap formation may in turn cause current collapse and gate lag, and thereby result in reversible degradations of transconductance and saturated drain current. Slow current transients are observed even if the drain voltage or gate voltage is changed abruptly. The slow transient response of the drain current when the drain-source voltage is pulsed is called the drain lag, or gate lag in the case of the gate-source voltage. When the voltage within the pulse is higher than the quiescent bias point, the buffer traps capture free charges. This phenomenon is very fast compared to the pulse length. When the voltage within the pulse is lower than the quiescent bias point, the traps release their charges. This process can be very slow, possibly even in a few seconds. As the free carriers are captured and released, they do not contribute to the output current instantaneously. This phenomenon is at the origin of current transients.

The combined effect of drain lag and gate lag leads to current collapse (reduction in the two-dimensional electron gas [2-DEG] density). The gate lag due to buffer traps becomes more pronounced when the deep-acceptor density in the buffer layer is higher. The inverse piezoelectric effect may occur when high reverse bias on the gate leads to crystallographic defect generation. Beyond a certain critical voltage, irreversible damage to a device may occur, which can provide a leakage path through the defects. Self-heating may occur under high power stress and may result in thermal stress-strain. Compound semiconductor devices may also suffer from electric field driven degradations, such as gate metallization and degradations at contacts, surfaces, and interfaces. Gate degradations may lead to increases in leakage current and dielectric breakdown.

High Temperature Reverse Bias (HTRB) testing is one of the most common reliability tests for power devices. An HTRB test evaluates long-term stability under high drain-source bias. HTRB tests are intended to accelerate failure mechanisms that are thermally activated through the use of biased operating conditions. During an HTRB test, the device samples are stressed at or slightly less than the maximum rated reverse breakdown voltage at an ambient temperature close to their maximum rated junction temperature over an extended period (e.g., 1,000 hours). This tests high temperature accelerates failure mechanisms according to the Arrhenius equation, which states the temperature dependence of reaction rates. Delamination, popping, device blow-up, and other mechanical issues may occur during HTRB tests.

Failure mechanisms similar to time-dependent dielectric breakdown (TDDB), a common failure mechanism in MOSFETs, are also observed in gate dielectrics of wide bandgap semiconductor devices, such as GaN power devices. TDDB happens when the gate dielectric breaks down because of long-time application of relatively low electric field (as opposite to immediate breakdown, which is caused by strong electric field). In addition, failures during temperature cycling (TMCL) may be related to package stress, bond pad metallization, mold compound, moisture sensitivity, and other package-level issues.

As discussed above, the engineered substrates may have CTEs matched to that of one or more of the epitaxial GaN device layers grown thereon. The epitaxial GaN device layers may also be lattice matched to the engineered substrates. Therefore, the epitaxial GaN device layers may have lower defect densities and higher qualities. Relatively thick drift regions may be formed by epitaxial growth. Also, large diameter wafers may be made from the engineered substrates, thereby lower manufacturing costs. The engineered substrates may improve device reliability. For example, having CTEs matched to that of the epitaxial GaN devices may help mitigate thermal stress, which is a critical factor in device reliability. Device failures related to thermal stress may include thermally-activated drain-source breakdown, punch through effect, breakdown along the channel, and breakdown through the buffer layer. Self-heating may also be reduced. In addition, high quality epitaxial GaN layers with low defect density may help improve device reliability, as some defects may be activated with voltage stress and may contribute to lateral and vertical leakage. High quality epitaxial GaN layers may also address issues such as localized non-stoichiometric regions that can affect field distributions and dislocation densities.

Traditional silicon-based MOSFET technology is nearing the physical limit of performance and switching speeds. Lateral GaN-based high electron mobility transistors (HEMTs) offer an opportunity to go beyond the silicon-based MOSFET realm in medium to low-power systems, such as solar inverters, compact power supply (PFC), switch-mode power supply (SMPS), motor drives, RF power amplifiers, solid state lighting (SSL), smart grid, and automotive motor drive systems. Lateral GaN-based HEMTs may afford high efficiency, high-frequency operation, and low switching and conduction loss, among many other advantages.

Figure 9:
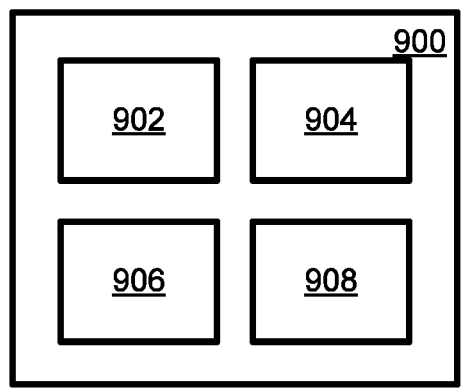
FIG. 9 is a simplified plan view of a plurality of devices formed on an engineered substrate according to another embodiment of the present invention.

Some embodiments of the present invention use the mechanical and electrical properties provided by the engineered substrate to integrate different device types, such as lateral GaN-based power devices and optoelectronics, onto a single substrate. FIG. 9 is a simplified plan view of a plurality of devices fabricated on an engineered substrate 900. The unique properties of the engineered substrate described above facilitate integration of devices that cannot be combined on other substrates. The engineered substrate provides an insulating substrate with good thermal conductivity on which high-quality thick GaN can be grown. For example, the engineered substrate 900 can include an integrated circuit with a plurality of devices, each device being of a different type. A first device 902 can be a lateral enhancement-mode (normally OFF) high electron mobility transistor (HEMT). A second device 904 can be a lateral depletion-mode (normally ON) HEMT. A third device 906 can be a vertical enhancement-mode HEMT and a fourth device 908 can be a vertical depletion mode HEMT.

The device types are not limited to the examples provided herein. Any combination of enhancement-mode (EM) devices and depletion-mode (DM) devices can be formed on the engineered substrate 900. While lateral devices are preferred for most integrated circuits, embodiments described herein using engineered substrate 900 can combine EM or DM lateral devices with EM or DM vertical devices. In addition to differences in lateral dimensions, adjacent devices on a substrate 900 can differ in semiconductor structure and construction. The structure and construction can be used to control the operational voltage and current differences for individual devices. In addition to individual device properties, processes described herein can provide electrical isolation between the individual devices. Accordingly, the engineered substrate 900 provides a surface on which devices can be isolated. In some embodiments, the plurality of devices can be fabricated on the engineered substrate such that there is no electrical conduction between the plurality of devices through the substrate. One of ordinary skill in the art would recognize many variations, modifications, and alternatives.

Figure 10A:
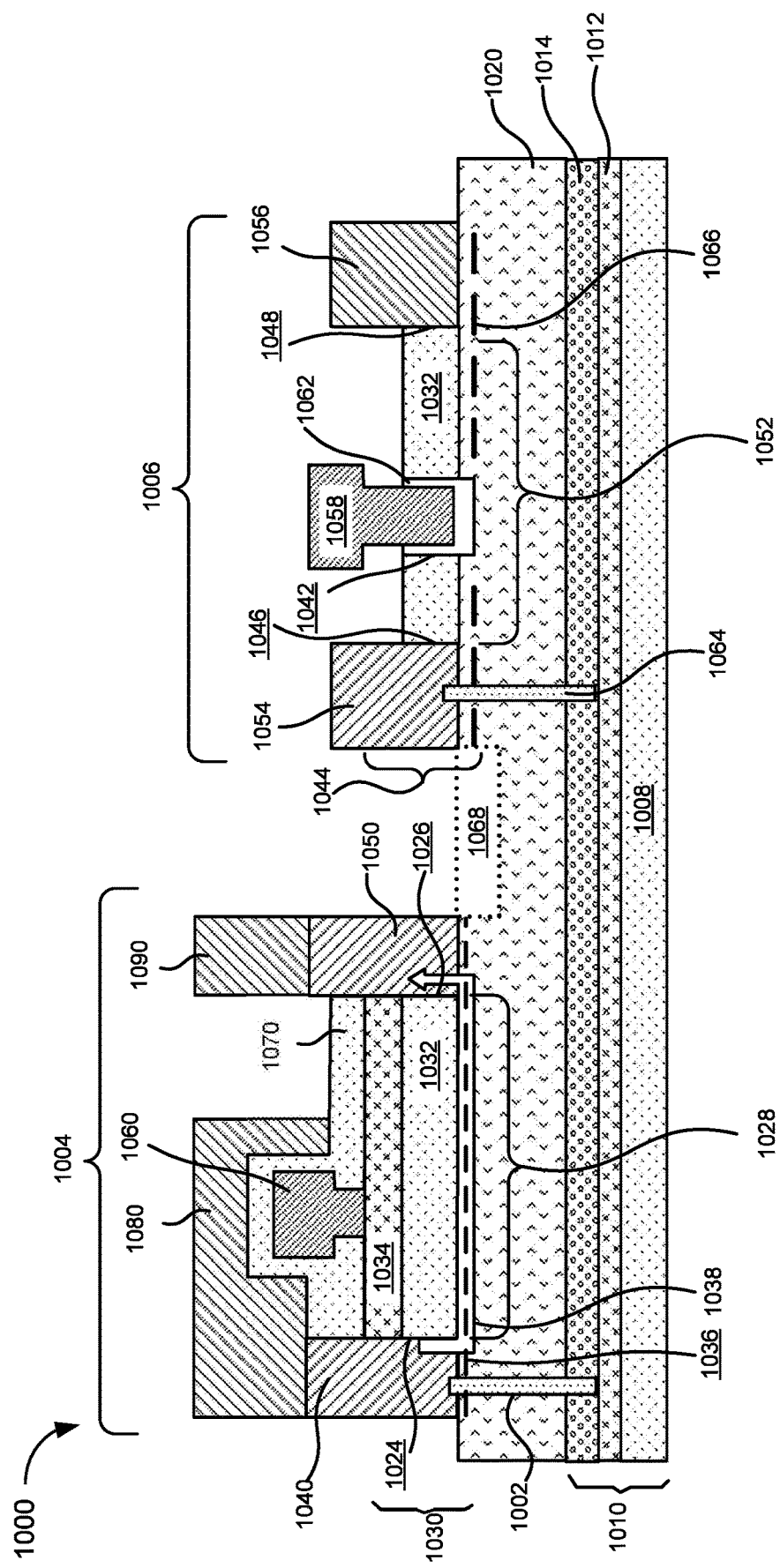
FIG. 10A is a simplified schematic cross-sectional diagram illustrating a plurality of devices formed on an engineered substrate according to another embodiment of the present invention.

FIG. 10A is a simplified schematic cross-sectional diagram illustrating a plurality of devices formed on an engineered substrate 1010 according to another embodiment of the present invention. The plurality of devices includes a first device 1004 fabricated according to a process flow that causes the device to function as a depletion-mode (normally ON) HEMT and a second device 1006 fabricated according to a process flow that includes a recess 1042 in a second channel region 1044. The recess 1042 in the second channel region 1044 causes the second device 1006 to function as an enhancement-mode (normally OFF) HEMT. The plurality of devices can be formed on an engineered substrate 1010 according to a unique set of device requirements for each of the plurality of devices. In some embodiments, as described above with reference to FIGS. 1, 3, and 4, the engineered substrate 1010 may include a polycrystalline ceramic core 1008, a first adhesion layer coupled to the polycrystalline ceramic core 1008, a barrier layer coupled to the first adhesion layer, a bonding layer coupled to the barrier layer, and a substantially single crystal layer coupled to the bonding layer. In come embodiments, the adhesion, bonding, and barrier layers can be formed as a shell that encompasses the polycrystalline ceramic core 1008.

Although FIG. 10A illustrates the first device 1004 as a depletion-mode (normally ON) HEMT and the second device 1006 as an enhancement-mode (normally OFF) HEMT, the first device 1004 and the second device 1006 may be both depletion-mode (normally ON) HEMTs, or both enhancement-mode (normally OFF) HEMTs according to various embodiments.

According to an embodiment, the engineered substrate 1010 may further include a substantially single crystal layer 1012 coupled to the bonding layer. For example, the substantially single crystal layer 1012 may comprise substantially single layer crystalline silicon. In some embodiments, the engineered substrate 1010 may further include a nucleation layer 1014 coupled to the substantially single crystal layer 1012 for facilitating the formation of the epitaxial device layers including substantially single crystal GaN-based materials. In some embodiments the nucleation layer 1014 may be doped at levels equal to, less than, or greater than the surrounding layers. In other embodiments, the composition of the nucleation layer may be designed and implemented with a predetermined composition.

In another embodiment, the polycrystalline ceramic core 1008 of the engineered substrate 1010 comprises aluminum nitride. In some embodiments, as discussed above with reference to FIG. 1, the engineered substrate 1010 may further include a conductive layer coupled to the first adhesion layer, and a second adhesion layer coupled to the conductive layer, wherein the conductive layer and the second adhesion layer are disposed between the first adhesion layer and the barrier layer. In some embodiments, the first adhesion layer may comprise a first tetraethyl orthosilicate (TEOS) oxide layer, and the second adhesion layer may comprise a second TEOS oxide layer. The barrier layer may comprise a silicon nitride layer. The conductive layer may comprise a polysilicon layer.

According to an embodiment, the plurality of devices 1000 further includes a buffer layer 1020 (e.g., a gallium nitride (GaN) buffer layer) coupled to the nucleation layer 1014 and the substantially single crystal layer 1012. The buffer layer 1020 may be formed by epitaxial growth on either the nucleation layer 1014 or the substantially single crystal layer 1012. According to an embodiment, the buffer layer 1020 may have a thickness greater than about 20 μm. In some embodiments, the buffer layer 1020 can be implemented as an aluminum gallium nitride (i.e., $Al_xGa_{1-x}N$) buffer layer or be a combination of GaN and AlGaN layers, for example, multiple layers of a single material or multiple layers of different materials. It should be noted that in some embodiments, layers discussed as GaN layers can be replaced with $Al_xGa_{1-x}N$ layers. As an example, the buffer layer 1020 can be replaced with $Al_xGa_{1-x}N$ having a first set of mole fractions and the barrier layer 1032 can be $Al_xGa_{1-x}N$ having a second set of mole fractions. One of ordinary skill in the art would recognize many variations, modifications, and alternatives.

A power device that uses an $Al_xGa_{1-x}N$ buffer layer can introduce a channel region 1030 by fabricating the $Al_xGa_{1-x}N$ buffer layer with a first predetermined mole fraction (x) extending from the engineered substrate and a second predetermined mole fraction (x) near the source, gate, and drain contacts. The first predetermined mole fraction (x) can be low, for example, less than 10%, to provide the desired carrier confinement. In other embodiments, the aluminum mole fraction (x) ranges from 10% to 30%. The $Al_xGa_{1-x}N$ epitaxial layer may be doped with iron or carbon to further increase the resistivity of the epitaxial layer, which serves as an insulating or blocking layer. Additional description related to materials used for the epitaxial buffer layer and fabrication of the epitaxial buffer layer is provided in U.S. Provisional Patent Application No. 62/447,857, the disclosure of which is hereby incorporated by reference in its entirety for all purposes.

A thicker buffer layer 1020 may afford the plurality of devices 1000 a lower leakage current and a higher breakdown voltage. In some embodiments, the buffer layer 1020 may include a plurality of layers. For example, the buffer layer 1020 may comprise an aluminum nitride layer, an aluminum gallium nitride, and a gallium nitride layer. In some embodiments, the buffer layer 1020 may include a superlattice of as many as 150 layers, each layer having a thickness of about 2-3 nm. A superlattice is an artificial lattice fabricated by a periodic epitaxial growth. A periodic superlattice is realized by growing alternate layers of two semiconductors on top of each other, each semiconductor being grown to the same thickness and mole fraction each time. According to some embodiments of the present invention, the advantage of using a superlattice instead of other buffer layer designs is that the superlattice can reduce the sheet resistance by growing, for example, AlGaN/GaN superlattice layers over the channel region and can reduce the potential barrier height at the hetero-interface. In other embodiments, the superlattice does not reduce the potential barrier height at the hetero-interface. One of ordinary skill in the art would recognize many variations, modifications, and alternatives.

According to an embodiment, the plurality of devices 1000 further includes a channel region for each device. The channel region for each device can be fabricated by forming one or more epitaxial III-V layers on the buffer layer 1020. The first device 1004 includes a first channel region 1030 that corresponds to a region near the interface of the one or more epitaxial III-V layers associated with the first device 1004 and the buffer layer 1020. The first channel region 1030 has a first end 1024, a second end 1026, and a central portion 1028 disposed between the first end 1024 and the second end 1026. The central portion of the first channel region 1030 may include a channel region barrier layer. In some embodiments, the channel region barrier layer can be barrier layer 1032 (e.g., an aluminum gallium nitride ($Al_xGa_{1-x}N$) barrier layer) coupled to the buffer layer 1020, and a cap layer 1034 (e.g., a gallium nitride cap layer) coupled to the barrier layer 1032. The cap layer 1034 helps decrease the reverse leakage through the Schottky contact and reduce the peak electric field. The cap layer 1034 also protects the barrier layer 1032 during processing and prevents nitrogen degassing. Additionally, cap layer 1034 also has a positive impact on device performance such as increased gain, increased power added efficiency, and improved DC stability.

The first device 1004 further includes a source contact 1040 disposed at the first end of the first channel region 1030, a drain contact 1050 disposed at the second end of the first channel region 1030, and a gate contact 1060 coupled to the cap layer 1034 and disposed in the central portion of the channel region 1030. In some embodiments, a via 1002 can connect the source contact 1040 to the single crystal layer 1012 or a conducting layer in order to remove parasitic charges in the power device. In contrast with GaN on silicon, which can utilize backside contacts through a conductive silicon substrate, embodiments of the present invention utilizing an insulating engineered substrate can utilize vias such as via 1002 to provide for electrical connectivity to the single crystal layer 1012. According to embodiments of the present invention, the barrier layer 1032 and the cap layer 1034 are formed by epitaxial growth. As illustrated in FIG. 10A, in operation, a thin two-dimensional electron gas (2DEG) layer 1036 may be formed in the buffer layer 1020 at the interface between the buffer layer 1020 and the barrier layer 1032. The electrons in this thin 2DEG layer 1036 can move quickly without colliding with any impurities because the buffer layer 1020 is undoped. This may give channel 1038 a very low resistivity, in other words, very high electron mobility.

In some embodiments, the first device 1004 may further include a passivation layer 1070 covering the cap layer 1034. The passivation layer 1070 may comprise silicon nitride or other insulating materials. The first device 1004 may also include a first field plate metal 1080 electrically connecting to the source contact 1040 forming a source electrode and a second metal 1090 disposed on the drain contact 1050 forming a drain electrode.

The plurality of devices 1000 further includes the second device 1006. The second device can share one or more epitaxial III-V layers with the first device 1004, such as the barrier layer 1032. The second device can use a recess 1042 in a second channel region 1044 to function as an enhancement mode (normally OFF) HEMT. The second device 1006 can be formed on the same engineered substrate 1010 as the first device 1004. According to an embodiment, the second device 1006 can be formed on the same buffer layer 1020 as the first device 1004.

The second device 1006 includes the second channel 1044 that corresponds to a region near the interface of the one or more epitaxial III-V layers associated with the second device 1006 and the buffer layer 1020. The channel region 1044 has a first end 1046, a second end 1048, and a central portion 1052 disposed between the first end 1046 and the second end 1048. The central portion 1052 of the channel region 1044 may include an epitaxial channel region barrier layer. In some embodiments, the epitaxial channel region barrier layer can be the barrier layer 1032 (e.g., an aluminum gallium nitride ($Al_xGa_{1-x}N$) barrier layer) coupled to the buffer layer 1020. According to embodiments of the present invention, the barrier layer 1032 is formed by epitaxial growth. The barrier layer 1032 includes a recess 1042 in the central portion of the channel region 1052. The recess may be formed by removing a portion of the barrier layer 1032 using etching or other suitable techniques. The second device 1006 further includes an insulating layer 1062 disposed in the recess and coupled to the barrier layer 1032.

The second device 1006 further includes a source contact 1054 disposed at the first end of the channel region 1044, a drain contact 1056 disposed at the second end of the channel region 1044, and a gate contact 1058 coupled to insulating layer 1062 and disposed in a central portion of the channel region 1044. In various embodiments, the gate contact 1058 can be coupled to a multilayer epitaxial gate structure. The epitaxial gate structure can be formed on the barrier layer in lieu of removing a portion of the barrier layer to form a normally off HEMT. In some embodiments, via 1064 can be used to connect the source contact 1054 to the single crystal layer 1012 in order to remove parasitic charges in the second device 1006.

As illustrated in FIG. 10A, a thin 2DEG layer 1066 may be formed in the buffer layer 1020 adjacent to the barrier layer 1032 associated with the second device 1006. The electrons in this thin 2DEG layer 1066 can move quickly without colliding with any impurities because the buffer layer 1020 is undoped. This may give the second channel region 1044 very low resistivity, in other words, very high electron mobility. In depletion mode, (normally OFF), the recess 1042 and insulating layer 1062 block a portion of the 2DEG layer when the gate voltage is zero. Additional description related to materials and fabrication of the epitaxial buffer layer and the epitaxial gate structure is provided in U.S. patent application Ser. No. 15/684,724, the disclosure of which is hereby incorporated by reference in its entirety for all purposes.

The plurality of devices 1000 can be isolated by a non-conducting buffer layer. In some embodiments, the plurality of devices 1000 can be further isolated by forming a recess 1068 in a portion of the buffer layer 1020. The recess 1068 can be formed by removing a portion of the buffer layer 1020 disposed between the devices. The recess can be formed by removing a portion of the buffer layer 1020 using etching or other suitable techniques. One of ordinary skill in the art would recognize many variations, modifications, and alternatives.

FIG. 10B is a simplified schematic cross-sectional diagram illustrating a plurality of epitaxial III-V layers that can be formed on an engineered substrate according to another embodiment of the present invention. In some embodiments, a plurality of epitaxial III-V layers can be formed on the engineered substrate 1010. For example, a back contact layer 1015 can be formed on the engineered substrate 1010. The buffer layer 1020 can be formed on the back contact layer 1015. A channel layer 1021 can be formed on the buffer layer 1020. The channel layer 1021 can be formed, for example, by fabricating an $Al_xGa_{1-x}N$ buffer layer 1020 with a first predetermined mole fraction (x) extending from the engineered substrate 1010 and/or the back contact layer 1015 and a second predetermined mole fraction (x) to form the channel layer 1021. Next, a p-type GaN layer, or p-GaN layer 1023, can be formed on the channel layer 1021. A second buffer layer 1025 can be formed on the p-GaN layer 1023. A second channel layer 1027 can be formed on the second buffer layer 1025. The thickness of the first buffer layer 1020 and the second buffer layer 1025 can be based on, or associated with the voltage rating of one or more devices formed by the epitaxial III-V layers. In some embodiments, the thickness can range from 1 μm to 15 μm. In some embodiments, an AlGaN gate layer 1029 can be formed on the second channel layer 1027.

FIG. 10C is a simplified schematic cross-sectional diagram illustrating a plurality of devices formed on an engineered substrate according to another embodiment of the present invention. In some embodiments, portions of the epitaxial III-V layers illustrated in FIG. 10B can be selectively removed using one or more CMOS compatible processing techniques to form a plurality of devices on the engineered substrate, for example a HEMT device and a lateral junction gate field-effect-transistor (LJFET). For example, portions of the AlGaN gate layer 1029 can be removed to expose portions of the second channel layer 1027 and form a first gate 1047 for an HEMT device. A first HEMT gate contact 1033 can be formed on the first gate 1047. A first HEMT drain contact 1035 and a first HEMT source contact 1031 can be formed on the exposed portions of the second channel layer 1027.

In some embodiments, one or more portions of the second buffer layer 1025 can be removed to expose the p-GaN layer 1023. An HEMT back contact 1037 can be formed on a first exposed portion of the p-GaN layer 1023 and a second LJFET gate contact 1041 can be formed on a second exposed portion of the p-GaN layer 1023. One or more portions of the p-GaN layer 1023 can be removed to form one or more exposed portions of the channel layer 1021. A second LJFET source contact 1039 and a first LJFET drain contact 1043 can be formed on the one or more exposed portions of the channel layer 1021. One or more portions of the channel layer 1021 and the buffer layer 1020 can be removed to expose one or more portions of the back contact layer 1015. An HEMT back contact 1045 can be formed on one or more exposed portions of the back contact layer 1015. It should be appreciated that the specific layers and devices illustrated in FIGS. 10B and 10C provide a particular arrangement of integrated devices formed on an engineered substrate according to an embodiment of the present invention. Other layers, devices, or contacts may also be formed thereon according to alternative embodiments. Moreover, the individual devices, layers, and components illustrated in FIGS. 10B and 10C may include multiple sub-layers that may be fabricated in various arrangements as appropriate to the individual device. Furthermore, additional devices, layers, or components may be added or existing layers or components may be removed depending on the particular applications. One of ordinary skill in the art would recognize many variations, modifications, and alternatives.

Figure 11:
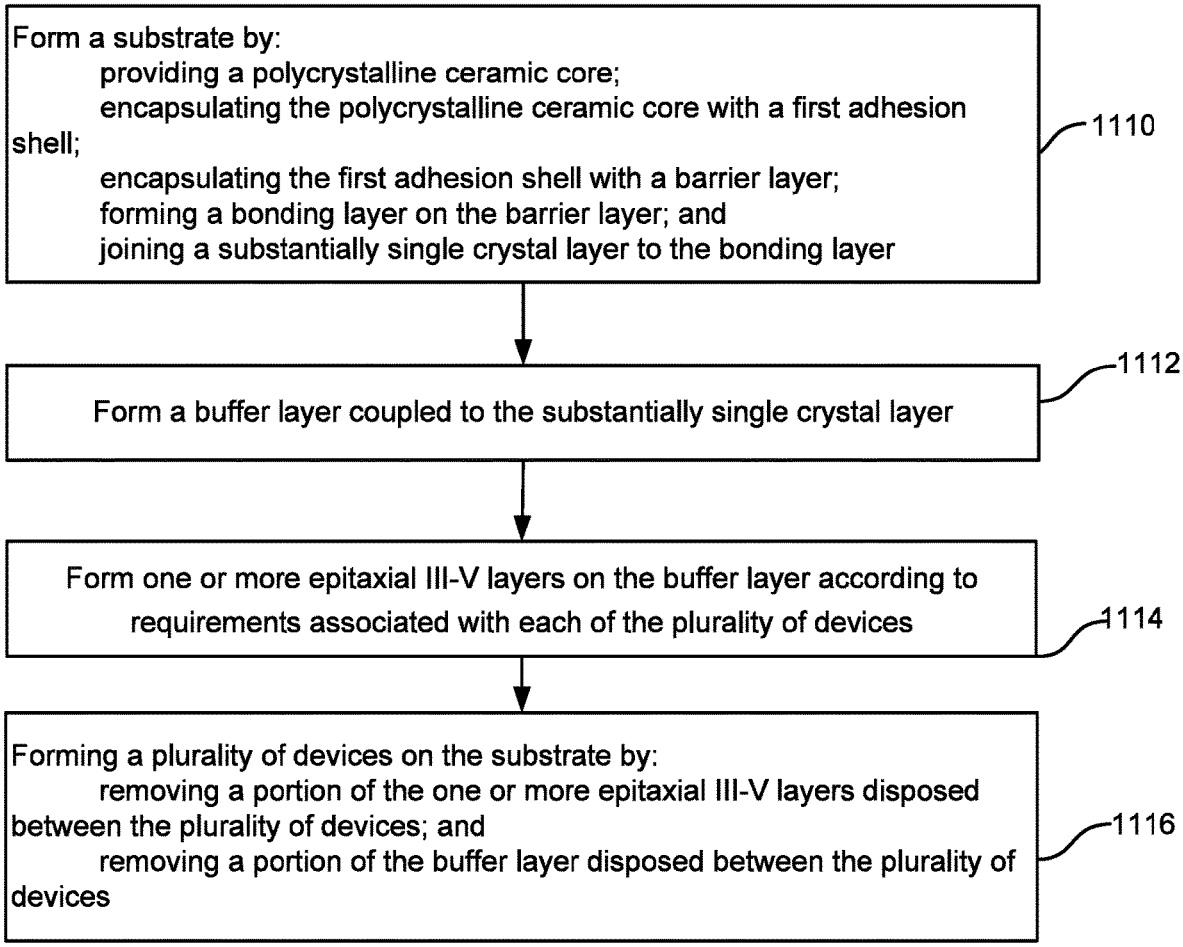
FIG. 11 is a simplified flowchart illustrating a method of fabricating a plurality of devices on an engineered substrate according to another embodiment of the present invention.

FIG. 11 is a simplified flowchart illustrating a method 1100 of fabricating a plurality of devices on an engineered substrate according to an embodiment of the present invention. According to an embodiment, the method 1100 includes, at 1110, forming a substrate by: providing a polycrystalline ceramic core, encapsulating the polycrystalline ceramic core with a first adhesion shell, encapsulating the first adhesion shell with a barrier layer, forming a bonding layer on the barrier layer, and joining a substantially single crystal layer to the bonding layer.

The method 1100 further includes at 1112, forming a buffer layer, (e.g., a GaN buffer layer) on the substrate and, at 1114, forming one or more epitaxial III-V layers on the buffer layer according to requirements associated with the plurality of devices. In some embodiments, forming the one or more epitaxial III-V layers can include forming a channel region on the buffer layer by: forming an epitaxial III-V barrier layer (e.g., an $Al_xGa_{1-x}N$ barrier layer) on the buffer layer and forming an epitaxial cap layer, (e.g., a gallium nitride cap layer) on the barrier layer. The channel region has a first end and a second end, and a central portion between the first end and the second end.

The method 1100 further includes, at 1116, forming a plurality of devices on the substrate by removing a portion of the one or more epitaxial III-V layers disposed between the plurality of devices and removing a portion of the buffer layer disposed between the plurality of devices. The one or more epitaxial III-V layers can include active layers. The active layers and the buffer layers can be etched using techniques such as a chemical etch or a plasma etch. The active layers and the buffer layers can be removed to a certain depth. In some embodiments the depth is dependent on device requirements.

In some embodiments, forming the plurality of devices can include: forming a plurality of source contacts, each source contact being at the first end of a channel region associated with one or more devices of the plurality of devices; forming a plurality of drain contacts, each drain contact being at a second end of the channel region associated with one or more devices of the plurality of devices; and forming a gate contact central portion of the channel region, each gate contact being associated with one or more devices of the plurality of devices. In some embodiments the gate contact can be formed on a cap layer and/or an epitaxial gate structure.

In some embodiments, forming the plurality of devices on the substrate can further include planarizing, by various methods, the plurality of devices. Methods include, for example, depositing a dielectric material and performing a chemical-mechanical planarization (CMP). In various embodiments, different device types can be integrated monolithically on the same engineered substrate using device interconnections. In some embodiments street etching can be used to further isolate a first set of integrated devices from a second set of integrated devices. Following integration of the different device types, conductive pads can be formed on the integrated devices and the integrated devices can be packaged for use as an integrated circuit.

It should be appreciated that the specific steps illustrated in FIG. 11 provide a particular method of fabricating a plurality of devices on an engineered substrate according to another embodiment of the present invention. Other sequences of steps may also be performed according to alternative embodiments. For example, alternative embodiments of the present invention may perform the steps outlined above in a different order. Moreover, the individual steps illustrated in FIG. 11 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 12:
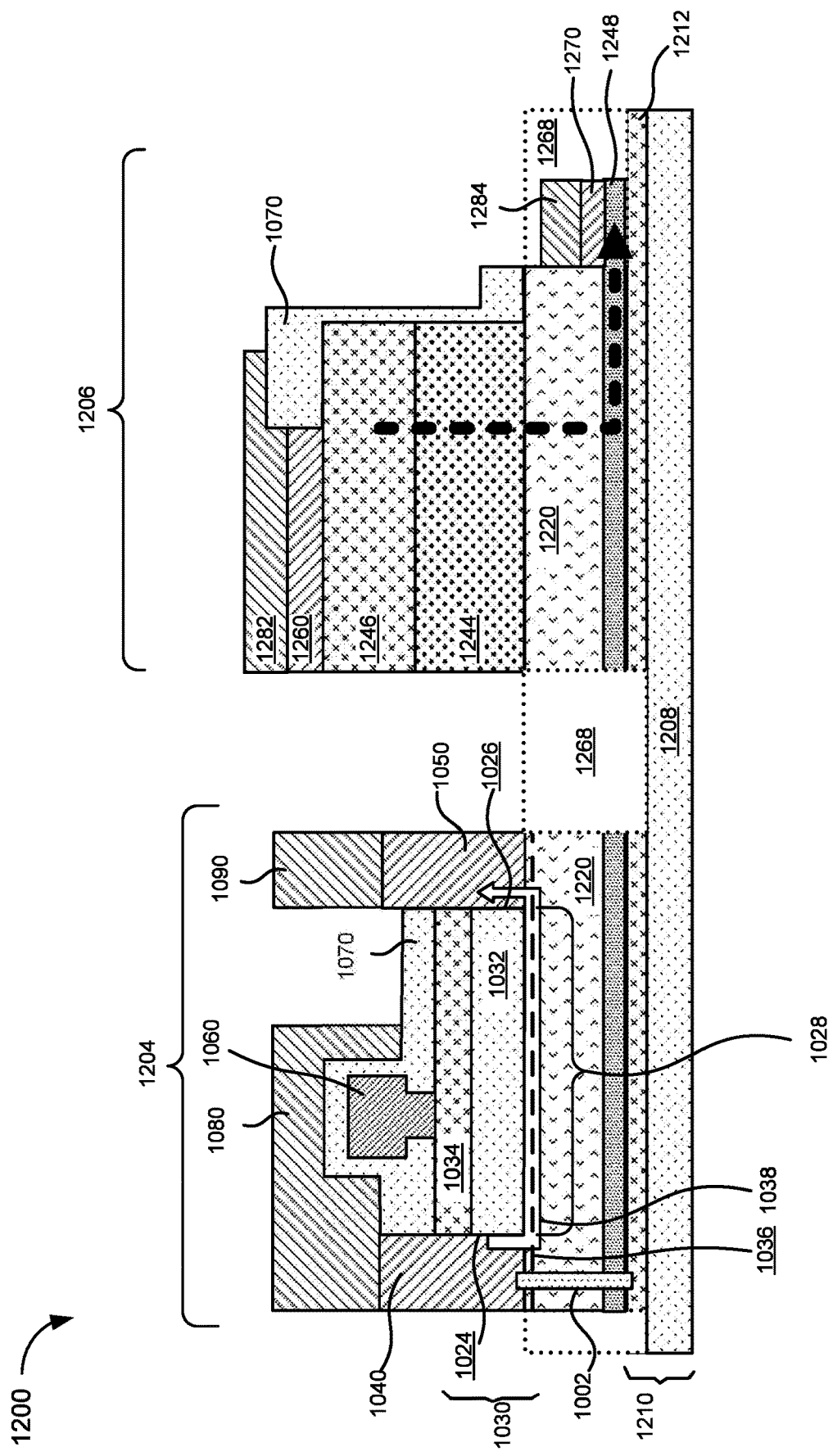
FIG. 12 is a simplified schematic cross-sectional diagram illustrating a plurality of devices formed on an engineered substrate according to another embodiment of the present invention.

FIG. 12 is a simplified schematic cross-sectional diagram illustrating a plurality of devices 1200 formed on an engineered substrate 1210 according to another embodiment of the present invention. The plurality of devices includes a first device 1204 fabricated on an engineered substrate 1210, a conducting layer 1248, and a buffer layer 1220. In some embodiments, the conducting layer 1248 is coupled to the engineered substrate 1210 and the buffer layer 1220. The first device 1204 is similar to the first device 1004 illustrated in FIG. 10A. In some embodiments, the second device 1206 can be fabricated using the same engineered substrate 1210, conducting layer 1248 and buffer layer 1220 as the first device 1204.

In some embodiments, as described above with references to FIGS. 1, 3, and 4, the engineered substrate 1210 may include a polycrystalline ceramic core 1208, a first adhesion layer coupled to the polycrystalline ceramic core 1208, a barrier layer coupled to the first adhesion layer, a bonding layer coupled to the barrier layer, and a substantially single crystal layer coupled to the bonding layer. According to an embodiment, the engineered substrate 1210 may further include a substantially single crystal layer 1212 coupled to the bonding layer. For example, the substantially single crystal layer 1212 may comprise substantially single crystalline silicon. In some embodiments, the engineered substrate 1210 may further include a nucleation layer (not shown) coupled to the substantially single crystal layer 1212 for facilitating the formation of the epitaxial device layers. In various embodiments, the polycrystalline ceramic core 1208 is comprised of the materials described above with reference to FIGS. 1, 3, 4, and 10.

According to an embodiment, the second device 1206 can be fabricated using the buffer layer 1220 coupled to the conducting layer 1248. The conducting layer 1248 is further coupled to the substantially single crystal layer 1212. In some embodiments, the buffer layer 1220 may be a superlattice that includes a plurality layers. For example, the buffer layer 1220 may include an aluminum nitride layer coupled to the single crystal silicon layer, an aluminum gallium nitride layer coupled to the aluminum nitride layer, and a gallium nitride layer coupled to the aluminum gallium nitride layer. The second device 1206 can include a semi-insulating layer (not pictured) coupled to the buffer layer 1220. In one embodiment, the semi-insulating layer comprises gallium nitride.

According to some embodiments, the buffer layer 1220 can be conducting. In various embodiments, the buffer layer 1220 can be doped to a predetermined concentration. The second device 1206 includes the buffer layer 1220 as a first N-type gallium nitride layer coupled to the conducting layer 1248, a second N-type gallium nitride layer 1244 coupled to the first N-type gallium nitride layer (buffer layer 1220), and a P-type gallium nitride layer 1246 coupled to the second N-type gallium nitride layer 1244. The buffer layer 1220 may serve as the N-region of the P-N diode and may have a relatively high N-type doping concentration. The second N-type gallium nitride layer 1244 may serve as a drift region and may have a relatively low doping concentration compared to that of the first N-type gallium nitride layer (buffer layer 1220). The P-type gallium nitride layer 1246 may serve as the P-region of the P-N diode and may have a relatively high P-type doping concentration.

In one embodiment, a portion of the second N-type gallium nitride layer 1244 and a portion of the P-type gallium nitride layer 1246 and the first N-type gallium nitride layer (buffer layer 1220) are removed to expose a portion of the conducting layer 1248 so that a cathode contact 1270 may be formed thereon. In other embodiments the cathode contact can be formed on the first N-type gallium nitride layer (buffer layer 1220). In some embodiments, the cathode contact 1270 may comprise a titanium-aluminum (Ti/Al) alloy or other suitable metallic materials. The portion of the first N-type gallium nitride layer (buffer layer 1220), the portion of the second N-type gallium nitride layer 1244, and the portion of the P-type gallium nitride layer 1246 may be removed by etching or other suitable techniques. An anode contact 1260 is formed on the remaining portion of the conducting layer 1248. In some embodiments, the anode 1260 may comprise a nickel-platinum (Ni/Pt) alloy, a nickel-gold (Ni/Au) alloy, or the like. The second device 1206 may further include a first field plate 1282 coupled to the anode contact 1260, and a second field plate 1284 coupled to the cathode contact 1270. In some embodiments, the second device 1206 may further include a passivation layer 1070 covering the exposed surfaces of the P-type gallium nitride layer 1246 and the first N-type gallium nitride layer (buffer layer 1220), and the second N-type gallium nitride layer 1244. The passivation layer 1290 may comprise silicon nitride or other insulating materials. In some other embodiments, the second device 1206 may be formed as a Schottky diode.

In some embodiments, the second N-type gallium nitride layer 1244 may have a thickness that is greater than about 20 µm. The unique CTE matching properties of the engineered substrate 1210 provide a substrate capable of being used to deposit a relatively thick drift region with low dislocation density. These properties can afford the second device 1206 low leakage current and a much higher breakdown voltage, as well as many other advantages.

The first device 1204 is electrically isolated from the second device 1206 by a deep etch. A deep etch of one or more layers 1268 can remove the buffer layer 1220, the conducting layer 1248, and the substantially single crystal layer 1212 to expose the polycrystalline ceramic core 1208 of the engineered substrate 1210. Individual device requirements or a specific application of the integrated circuit can determine whether a recess 1068 illustrated in FIG. 10A or the deep etch of one or more layers 1268 illustrated in FIG. 12 is fabricated. The deep etch of one or more etched layers 1268 can facilitate the fabrication of lateral device structures such as cathode contact 1270 adjacent to the buffer layer 1220. Further, the removal of the one or more etched layers 1268 can facilitate the fabrication of connections to a device backside as needed. One of ordinary skill in the art would recognize many variations, modifications, and alternatives.

Figure 13:
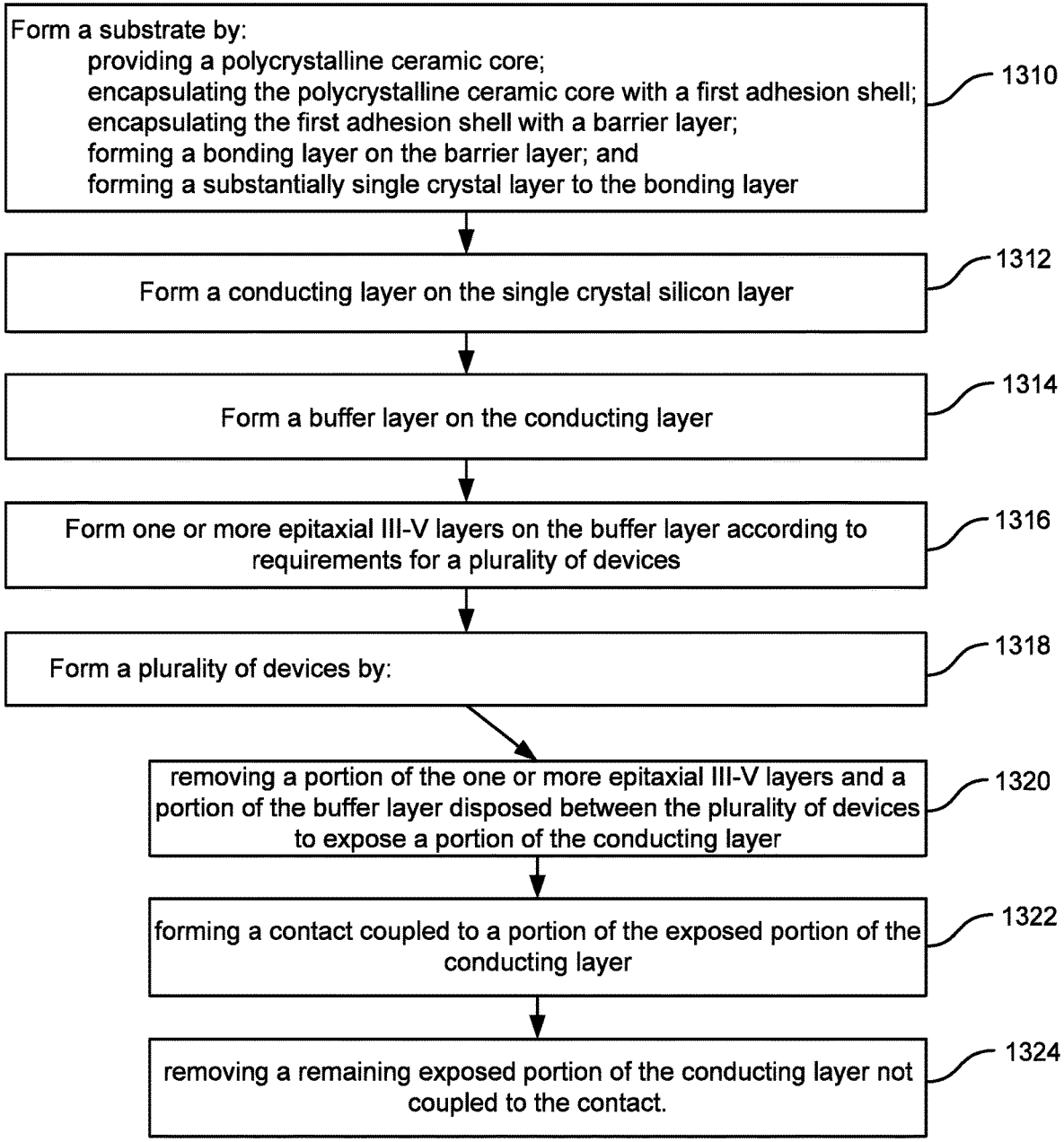
FIG. 13 is a simplified flowchart illustrating a method of fabricating a plurality of devices on an engineered substrate according to an embodiment of the present invention.

FIG. 13 is a simplified flowchart illustrating a method 1300 of fabricating a plurality of devices on an engineered substrate according to an embodiment of the present invention. The method 1300 includes, at 1310, forming a substrate by: providing a polycrystalline ceramic core, encapsulating the polycrystalline ceramic core with an adhesion shell, encapsulating the adhesion shell with a barrier layer, forming a bonding layer on the barrier layer; and forming a substantially single crystal layer coupled to the bonding layer.

The method 1300 further includes, at 1312, forming a conducting layer on the single crystal silicon layer; and at 1314, forming a buffer layer on the conducting layer. In some embodiments, the buffer layer can be conducting and the conducting layer can be a subset of properly doped epitaxial layers of a thicker buffer layer comprising a plurality of epitaxial layers. The method 1300 further includes, at 1316, forming one or more epitaxial III-V layers on the buffer layer according to requirements for a plurality of devices.

According to some embodiments, the method 1300 further includes, at 1318, forming a plurality of devices using the following steps: at 1320 removing a portion of the one or more epitaxial III-V layers and a portion of the buffer layer disposed between the plurality of devices to expose a portion of the conducting layer, at 1322, forming a contact coupled to a portion of the exposed portion of the conducting layer, and, at 1324, forming an anode contact on a remaining portion of the epitaxial P-type gallium nitride layer; and at 1326, removing a remaining exposed portion of the conducting layer not coupled to the contact. Portions of the epitaxial III-V layers, buffer layer, and conducting layer can be removed using techniques such as etching and CMP. In some embodiments, layers of the substrate described in FIG. 1 can be removed to a depth that reaches polycrystalline ceramic core.

In some embodiments, portions of the substrate can be removed to form one or more backside contacts to one or more of the plurality of devices. The plurality of devices can be planarized by various methods including filling in gaps using epoxy or photocurable polymer. After forming backside contacts and planarization, interconnections between the different types of devices can be fabricated. In various embodiments, different device types can be integrated monolithically on the same engineered substrate using device interconnections. In some embodiments street etching can be used to further isolate a first set of integrated devices from a second set of integrated devices. Following integration of the different device types, conductive pads can be formed on the integrated devices and the integrated devices can be packaged for use as an integrated circuit.

It should be appreciated that the specific steps illustrated in FIG. 13 provide a particular method of fabricating a plurality of devices on an engineered substrate according to another embodiment of the present invention. Other sequences of steps may also be performed according to alternative embodiments. For example, alternative embodiments of the present invention may perform the steps outlined above in a different order. Moreover, the individual steps illustrated in FIG. 13 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 14A:
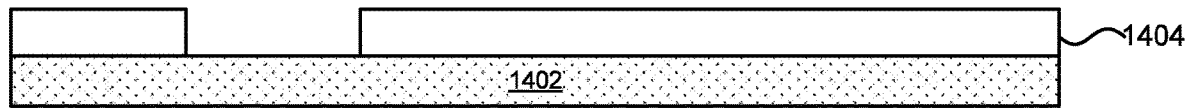
FIG. 14A-D are simplified schematic cross-sectional diagrams illustrating a plurality of devices with different buffer layer epitaxial structures manufactured on a single substrate according to another embodiment of the present invention.
Figure 14B:
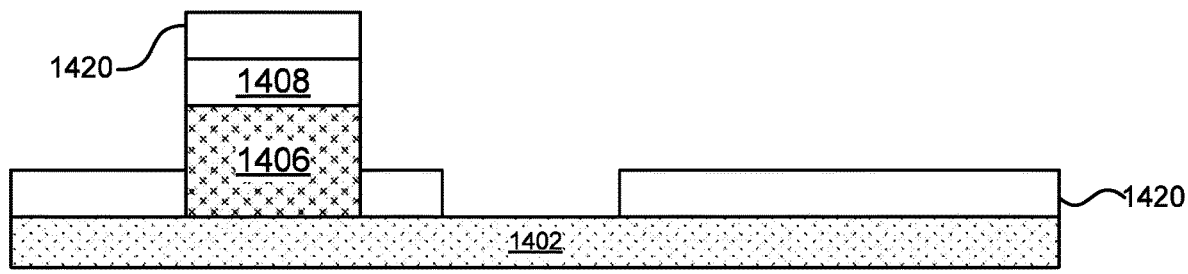
Figure 14C:
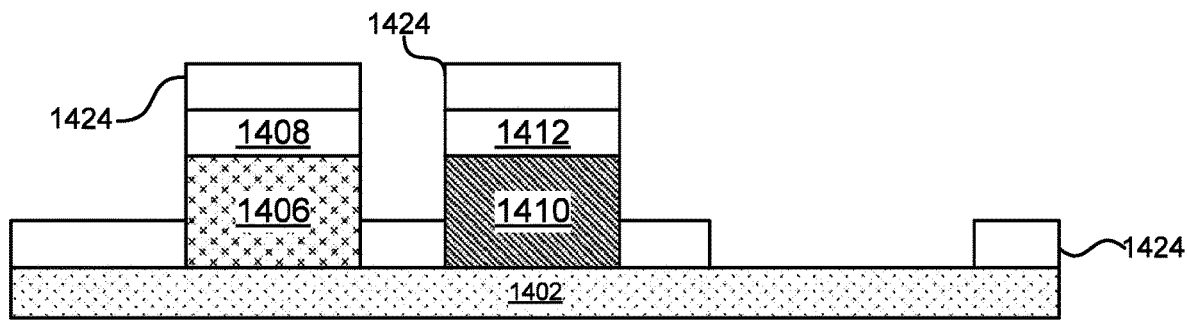
Figure 14D:
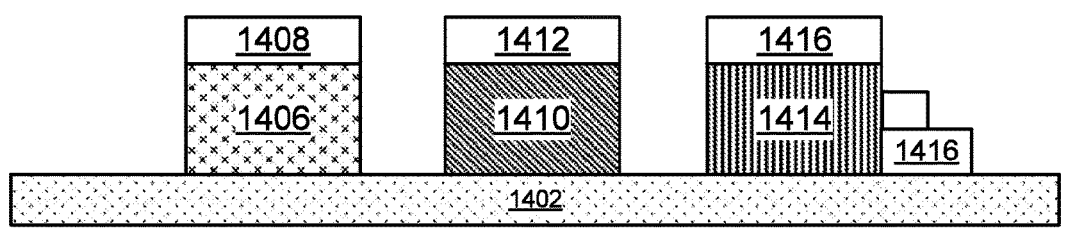

FIG. 14A is a simplified schematic cross-sectional diagram illustrating a substrate configured to fabricate a plurality of devices with different buffer layer epitaxial structures according to another embodiment of the present invention. FIG. 14A illustrates an engineered substrate 1402 with a mask 1404 configured to grow a first buffer layer 1406 and a first device structure 1408. FIG. 14B shows the engineered substrate 1402 after forming the first buffer layer 1406, the first device structure 1408 and a second mask 1420. The second mask 1420 formed on the engineered substrate 1402 covers the first buffer layer 1406 and the first device structure 1408. The second mask 1420 includes a window to grow a second buffer layer 1410 and a second device structure 1412. In some embodiments the second buffer layer 1410 and the second device structure 1412 can include different epitaxial layers and different structures than the first buffer layer 1406 and the first device structure 1408. FIG. 14C shows the engineered substrate 1402 after forming the second buffer layer 1410, the second device structure 1412, and a third mask 1424. The third mask 1424 includes a larger window to grow a third buffer layer 1414 and a third device structure 1416. In some embodiments, the window may be larger to facilitate forming an electrical contact with conducting layers at the base of the third buffer layer 1414. FIG. 14D shows the engineered substrate 1402 after forming the third buffer layer 1414 and the third device structure 1416. Any number of buffer layers and device types can be formed on the engineered substrate 1402 based on the requirements of a specific integrated circuit.

Once the buffer layers and devices are formed, the devices can be planarized by various methods such as filling gaps between the devices using an epoxy or photocurable polymer and performing CMP as required. After planarization, device interconnects can be fabricated and street etching can further isolate the integrated circuits on the engineered substrate 1402. After the device interconnects are fabricated, conductive pads can be formed and packaging can be completed. It should be appreciated that the specific steps illustrated in FIGS. 14A-14D provide a particular method of fabricating multiple islands on the same substrate with different epitaxial structures according to an embodiment of the present invention. Other sequences of steps may also be performed according to alternative embodiments. Moreover, the individual steps illustrated in FIGS. 14A-14D may include multiple substeps that may be performed in various sequences as appropriate to the individual step. Furthermore, additional steps may be added or existing steps may be removed depending on the particular applications. One of ordinary skill in the art would recognize many variations, modifications, and alternatives.

Figure 15:
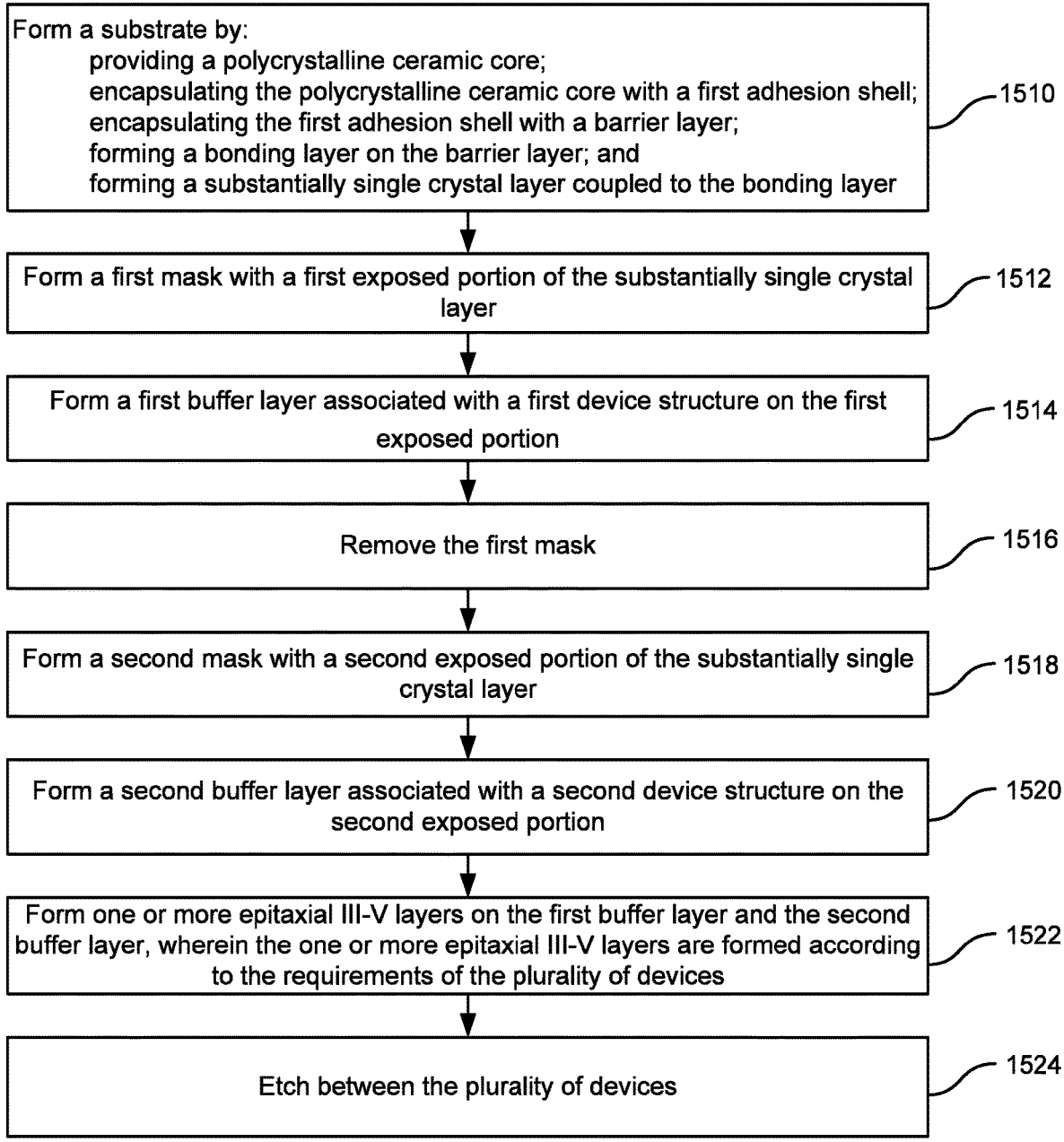
FIG. 15 is a simplified flowchart illustrating a method of fabricating a plurality of devices with different buffer layer epitaxial structures on a single substrate according to another embodiment of the present invention.

FIG. 15 is a simplified flowchart illustrating a method 1500 of fabricating a plurality of devices with different buffer layer epitaxial structures on a single substrate according to another embodiment of the present invention. The method 1500 includes, at 1510, forming a substrate by: providing a polycrystalline ceramic core, encapsulating the polycrystalline ceramic core with a first adhesion shell, encapsulating the first adhesion shell with a barrier layer, form a bonding layer on the barrier layer, and forming a substantially single crystal layer coupled to the bonding layer.

The method 1500 further includes, at 1512, forming a first mask with a first exposed portion of the substantially single crystal layer and, at 1514, forming a first buffer layer associated with a first device structure on the first exposed portion. The method 1500 further includes, at 1516, removing the first mask; at 1518, forming a second mask with a second exposed portion of the substantially single crystal layer; and at 1520 forming a second buffer layer associated with a second device structure on the second exposed portion. According to some embodiments, the first buffer layer can be an N-type gallium nitride layer with a first doping concentration. The second buffer layer can be a second epitaxial N-type gallium nitride layer with a second doping concentration different than the first doping concentration depending on device requirements.

According to some embodiments, the method 1500 further includes, at 1522, forming one or more epitaxial III-V layers on the first buffer layer and the second buffer layer, wherein the one or more epitaxial III-V layers are formed according to the requirements of the plurality of devices. The method further includes, at 1524, etching between the plurality of devices. Once the buffer layers and devices are formed, the devices can be planarized by various methods such as filling gaps between the devices using an epoxy or photocurable polymer and performing CMP as required. After planarization, device interconnects can be fabricated and street etching can further isolate the integrated circuits on the engineered substrate 1402. After the device interconnects are fabricated, conductive pads can be formed and packaging can be completed.

It should be appreciated that the specific steps illustrated in FIG. 15 provide a particular method of fabricating a plurality of devices with different buffer layer epitaxial structures on an engineered substrate according to another embodiment of the present invention. Other sequences of steps may also be performed according to alternative embodiments. For example, alternative embodiments of the present invention may perform the steps outlined above in a different order. Moreover, the individual steps illustrated in FIG. 15 may include multiple sub-steps that may be performed in various sequences as appropriate to the individual step. Furthermore, additional steps may be added or removed depending on the particular applications. One of ordinary skill in the art would recognize many variations, modifications, and alternatives.

Epitaxial growth and selective etching of the substrate can be used to form a particular integrated circuit and the devices that it includes. In some embodiments, device specialization schemes include pairs of an enhancement mode device and a depletion mode device. If the epitaxial layers of the buffer layer are grown in order to fabricate an enhancement mode device, an additive process or a subtractive process can be used to form a depletion mode device using the same substrate and buffer layer. If the additive process is selected, a depletion mode device can be fabricated by using selective epitaxy to deposit epitaxial material, for example, AlN, on the buffer layers. If the subtractive process is selected, a p-GaN etch can be used to form a depletion mode device.

In other embodiments, the epitaxial layers of the buffer layer are grown to fabricate a depletion mode device. In these embodiments, an enhancement mode device can be fabricated using an additive process or subtractive process. An enhancement mode device can be fabricated by a subtractive gate recess etch or by an additive atomic layer deposition (ALD) of p-GaN, for example, a p-GaN gate.

Figure 16A:
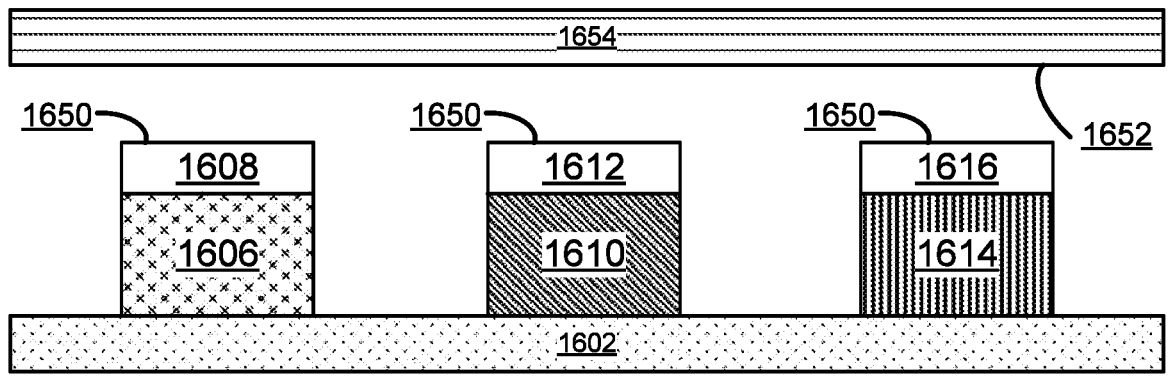
FIG. 16A-C illustrate embodiments of the invention used to form backside connections on devices grown on an engineered substrate.
Figure 16B:
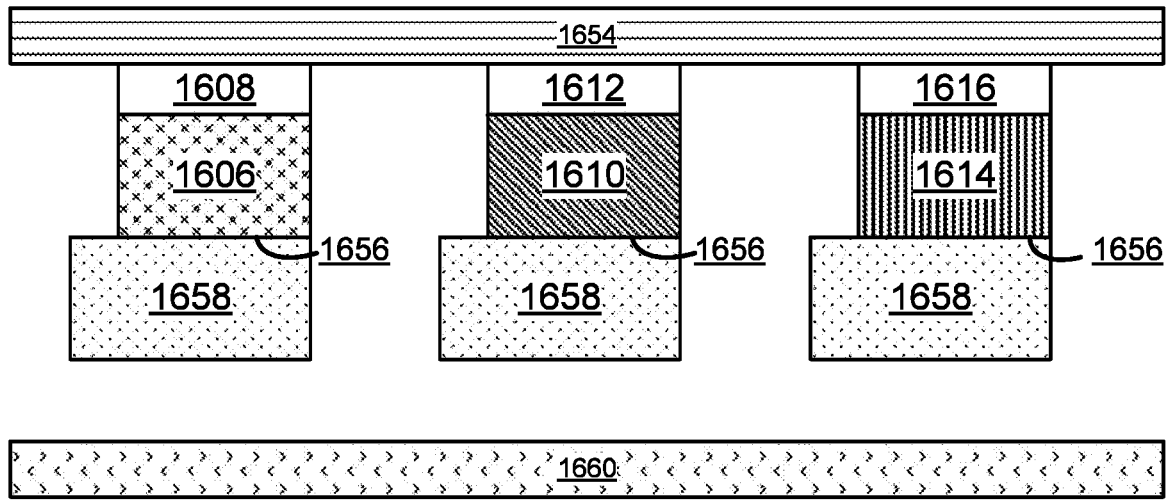

In some embodiments different vertical devices can be fabricated using an engineered substrate. FIG. 16A illustrates three devices fabricated on an engineered substrate 1602. A first surface 1650 on each of the plurality of devices can be bonded to a front surface 1652 of a temporary carrier 1654. The first, or front, surface 1650 of each device is opposed to the surface connected to the engineered substrate 1602. Once the devices are bonded to the temporary carrier 1654, the engineering substrate 1602 can be removed exposing a second surface 1656 on each device. FIG. 16B illustrates this particular embodiment. In some embodiments, after the engineered substrate 1602 is removed, additional layers can be removed from the second surface 1656 such as the single crystal layer and additional epitaxial layers depending on the device requirements. Following removal of the engineered substrate 1602 and any additional layers, a conductive layer 1658 can be formed on the exposed second surface 1656. In some embodiments copper can be electroplated on the second surface 1656. The conductive layer 1658 can be bonded to the carrier wafer 1660 and the temporary carrier can be removed.

Figure 16C:
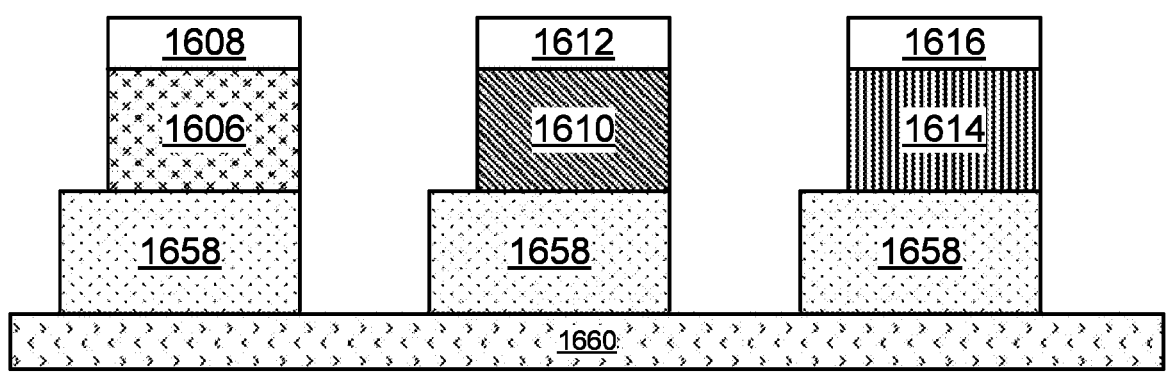

FIG. 16C illustrates the devices with the newly formed conducting layer 1658 bonded to the carrier wafer 1660. In some embodiments, after being bonded to the carrier wafer, the devices can be isolated by etching to the carrier wafer. In some embodiments a backside contact for one or more devices can be fabricated. In some embodiments, forming the plurality of devices on the substrate can further include planarizing, by various methods, the plurality of devices. Methods include, for example, depositing a dielectric material and performing a chemical-mechanical planarization. In various embodiments, different device types can be integrated monolithically on the same engineered substrate using device interconnections. In some embodiments street etching can be used to further isolate a first set of integrated devices from a second set of integrated devices. Following integration of the different device types, conductive pads can be formed on the integrated devices and the integrated devices can be packaged for use as an integrated circuit.

Several techniques can be used to remove the engineered substrate 1602 and additional layers. For example, a chemical such as hydrofluoric acid (HF) can be infused into the lateral sides of the wafer retaining the vertical semiconductor diode to etch out one or more of the buffer layer and the semi-insulating layer while the ceramic core and vertical semiconductor diode epitaxial stack remain intact. Etching one or more of the buffer layer and the semi-insulating layer separates the vertical semiconductor diode epitaxial stack from the remainder of engineered substrate while preserving the ceramic core for reuse. This chemical lift off process also reduces overall stress on the vertical semiconductor diode epitaxial stack by eliminating polishing processes. If a gallium nitride substrate is used, the substrate cannot be selectively removed. Additionally, gallium nitride substrates include defects such as face flipping, residual stress, fragility, and miscut planes that affect the quality of the epitaxial layers grown thereon. In some embodiments using a gallium nitride substrate, 75% of the resistance can be attributed to defects in the substrate. Embodiments of the present invention which remove the substrate to expose epitaxial layers for contact formation can thereby reduce the electrical and thermal resistance.

In some embodiments, a sacrificial layer may be used for the chemical lift off process. The sacrificial layer may use a metal such as titanium (Ti) that is highly susceptible to dissolving when exposed to HF. In some embodiments, the sacrificial layer may comprise one of titanium (Ti), vanadium (V), chromium (Cr), tantalum (Ta), tungsten (W), rhenium (Re), silicon oxide, silicon nitride, silicon oxynitride, or a combination thereof. In addition to the sacrificial layer, a protective layer can be used. Protective layers may prevent diffusion of materials from sacrificial layer 200, such as Ti, into epitaxial GaN layers during epitaxial GaN growth. Additional description related to removing the substrate, the buffer layer, and the semi-insulating layer is provided in U.S. patent application Ser. No. 15/288,506, the disclosure of which is hereby incorporated by reference in its entirety for all purposes. The substrate removal process described in relation to the vertical semiconductor diode can be used for any of the devices described herein. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming a plurality of devices comprising:
   forming a substrate by:
   providing a polycrystalline ceramic core;
   encapsulating the polycrystalline ceramic core with a first adhesion shell;
   encapsulating the first adhesion shell with a barrier layer;
   forming a bonding layer on the barrier layer; and
   forming a substantially single crystal layer coupled to the bonding layer;
   forming a buffer layer coupled to the substantially single crystal layer;
   forming one or more epitaxial III-V layers on the buffer layer according to requirements associated with the plurality of devices; and
   forming the plurality of devices on the substrate by:
   removing a portion of the one or more epitaxial III-V layers disposed between the plurality of devices; and
   removing a portion of the buffer layer disposed between the plurality of devices.

2. The method of claim 1 wherein the one or more epitaxial III-V layers comprise GaN.

3. The method of claim 1 further comprising planarizing the plurality of devices on the substrate.

4. The method of claim 3 wherein planarizing further comprises:
   forming a dielectric layer on the plurality of devices; and
   smoothing the plurality of devices using chemical-mechanical planarization.

5. The method of claim 1 further comprising fabricating one or more interconnects between a first device of the plurality of devices and a second device of the plurality of devices.

6. The method of claim 1 further comprising:
   bonding a first surface on each of the plurality of devices to a temporary carrier, wherein the first surface is opposed to the substrate;
   removing the substrate to expose a second surface on each of the devices;
   forming a conducting layer on the second surface; and
   bonding a carrier wafer to the conducting layer.

7. The method of claim 6 further comprising removing one or more sections of the carrier wafer to form one or more backside contacts.

8. The method of claim 1 wherein the plurality of devices comprises a depletion-mode high electron mobility transistor (HEMT), and an enhancement-mode HEMT.

9. The method of claim 1 wherein the plurality of devices comprises a first depletion-mode high electron mobility transistor (HEMT), and a second depletion-mode HEMT.

10. The method of claim 1 wherein the plurality of devices comprises a first enhancement-mode high electron mobility transistor (HEMT), and a second enhancement-mode HEMT.

11. The method of claim 1 wherein the plurality of devices comprises a high electron mobility transistor (HEMT) and a vertical device.

12. A method of forming a plurality of devices comprising:
forming a substrate by:
providing a polycrystalline ceramic core;
encapsulating the polycrystalline ceramic core with an adhesion shell;
encapsulating the adhesion shell with a barrier layer;
forming a bonding layer on the barrier layer; and
forming a substantially single crystal layer coupled to the bonding layer;
forming a conducting layer coupled to the substantially single crystal layer;
forming a buffer layer coupled to the conducting layer;
forming one or more epitaxial III-V layers on the buffer layer according to requirements for each of the plurality of devices; and
forming the plurality of devices by:
removing a portion of the one or more epitaxial layers and a portion of the buffer layer disposed between the plurality of devices to expose a portion of the conducting layer;
forming a contact coupled to a portion of the exposed portion of the conducting layer; and
removing a remaining exposed portion of the conducting layer not coupled to the contact.

13. The method of claim 12 further comprising planarizing the plurality of devices on the substrate.

14. The method of claim 13 wherein planarizing further comprises:
forming a dielectric layer on the plurality of devices; and
smoothing the plurality of devices using chemical-mechanical planarization.

15. The method of claim 12 further comprising fabricating one or more interconnects between a first device of the plurality of devices and a second device of the plurality of devices.

16. The method of claim 12 further comprising:
bonding a first surface on each of the plurality of devices to a temporary carrier, wherein the first surface is opposed to the substrate;
removing the substrate to expose a second surface on each of the devices;
forming a second conducting layer on the second surface; and
bonding a carrier wafer to the second conducting layer.

17. The method of claim 16 further comprising removing one or more sections of the carrier wafer to form one or more backside contacts.

18. The method of claim 12 wherein the plurality of devices comprises a high electron mobility transistor (HEMT) and a vertical device.

19. The method of claim 18 wherein the HEMT comprises a depletion-mode HEMT or an enhancement-mode HEMT.

20. The method of claim 18 wherein the vertical device comprises a vertical P-N diode or a vertical Schottky diode.

* * * * *